(12) United States Patent
Lee et al.

(10) Patent No.: US 11,961,559 B2
(45) Date of Patent: Apr. 16, 2024

(54) STORAGE DEVICE AND OPERATING METHOD OF STORAGE DEVICE

(71) Applicant: SAMSUNG ELECTRONICS CO., LTD., Suwon-si (KR)

(72) Inventors: Yunjung Lee, Seoul (KR); Hee-Woong Kang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 38 days.

(21) Appl. No.: 17/830,677

(22) Filed: Jun. 2, 2022

(65) Prior Publication Data

US 2023/0142506 A1   May 11, 2023

(30) Foreign Application Priority Data

Nov. 11, 2021   (KR) .................. 10-2021-0154813

(51) Int. Cl.
  *G11C 16/04*   (2006.01)
  *G11C 5/06*   (2006.01)
  (Continued)

(52) U.S. Cl.
  CPC .......... *G11C 16/0433* (2013.01); *G11C 5/063* (2013.01); *G11C 16/08* (2013.01); *G11C 16/26* (2013.01); *G11C 29/42* (2013.01)

(58) Field of Classification Search
  CPC ........ G11C 2029/0409; G11C 16/3418; G11C 16/349; G11C 11/5642; G11C 2029/0411;
  (Continued)

(56) References Cited

U.S. PATENT DOCUMENTS

| 7,679,133 B2 | 3/2010 | Son et al. |
| 8,374,026 B2 | 2/2013 | Sharon et al. |

(Continued)

FOREIGN PATENT DOCUMENTS

| EP | 3637421 A1 | 4/2020 |
| JP | 2007299456 A | 11/2007 |

(Continued)

OTHER PUBLICATIONS

Korean Examination Report dated Nov. 8, 2022 Cited in Corresponding Korean Patent Application.

(Continued)

*Primary Examiner* — Ajay Ojha
(74) *Attorney, Agent, or Firm* — Fish & Richardson P.C.

(57) ABSTRACT

A storage device includes a nonvolatile memory device and a memory controller allowing the nonvolatile memory device to perform a read operation on memory cells belonging to a selected page in a selected memory block. After the read operation, the memory controller allows the nonvolatile memory device to perform a first check read operation on memory cells of a first neighbor page while sequentially selecting sets of read voltages. After the first check read operation, the memory controller allows the nonvolatile memory device to perform a second check read operation on memory cells of a second neighbor page while sequentially selecting the sets of read voltages. In the second check read operation, the memory controller first selects a set of read voltages, which are used in the first check read operation in which error correction succeeds.

20 Claims, 15 Drawing Sheets

(51) Int. Cl.
*G11C 16/08* (2006.01)
*G11C 16/26* (2006.01)
*G11C 29/42* (2006.01)

(58) Field of Classification Search
CPC ..... G11C 29/52; G11C 16/0483; G11C 16/34; G11C 16/3454; G11C 16/3422; G06F 11/1048
See application file for complete search history.

(56) References Cited

U.S. PATENT DOCUMENTS

| | | | |
|---|---|---|---|
| 8,553,466 | B2 | 10/2013 | Han et al. |
| 8,559,235 | B2 | 10/2013 | Yoon et al. |
| 8,654,587 | B2 | 2/2014 | Yoon et al. |
| 9,009,390 | B2 | 4/2015 | Choi et al. |
| 9,361,997 | B2 | 6/2016 | Lee |
| 9,406,390 | B2 | 8/2016 | Kim et al. |
| 9,613,687 | B2 | 4/2017 | Kim et al. |
| 9,720,624 | B2 | 8/2017 | Moon et al. |
| 9,761,321 | B2 | 9/2017 | Lee |
| 9,852,804 | B2 | 12/2017 | Park et al. |
| 9,892,795 | B2 * | 2/2018 | Joo ................ G11C 16/3445 |
| 10,090,858 | B2 | 10/2018 | Cho et al. |
| 10,373,693 | B2 | 8/2019 | Cha et al. |
| 10,607,708 | B2 * | 3/2020 | Oh .................. G11C 16/3495 |
| 10,778,256 | B2 | 9/2020 | Lee |
| 10,802,728 | B2 | 10/2020 | Lee et al. |
| 11,029,886 | B2 | 6/2021 | Her et al. |
| 11,367,503 | B2 | 6/2022 | Kim |
| 2011/0233648 | A1 | 9/2011 | Seol et al. |
| 2016/0093394 | A1 | 3/2016 | Lee |
| 2021/0166774 | A1 | 6/2021 | Cha et al. |

FOREIGN PATENT DOCUMENTS

| | | |
|---|---|---|
| KR | 2012-0035064 A | 4/2012 |
| KR | 20140100327 A | 8/2014 |
| KR | 2016-0022451 | 3/2016 |
| KR | 2016-0037349 | 4/2016 |
| KR | 2017-0070921 | 6/2017 |
| KR | 20190051570 A | 5/2019 |
| KR | 10-2128406 | 7/2020 |
| KR | 2021-0012190 | 2/2021 |
| KR | 20210121650 | 10/2021 |

OTHER PUBLICATIONS

European Search Report in European Appln. No. 22184395.6, dated Jan. 4, 2023, 4 pages.

European Examination Report dated Jan. 4, 2023 Cited in Corresponding European Patent Application.

* cited by examiner

STORAGE DEVICE AND OPERATING METHOD OF STORAGE DEVICE

CROSS-REFERENCE TO RELATED APPLICATIONS

This application claims priority under 35 U.S.C. § 119 to Korean Patent Application No. 10-2021-0154813 filed on Nov. 11, 2021, in the Korean Intellectual Property Office, the disclosure of which is incorporated by reference herein in its entirety.

BACKGROUND

Embodiments of the present disclosure described herein relate to a semiconductor device, and more particularly, relate to a storage device capable of reducing the number of times, and a period, of a check operation such that a latency decreases, with reliability maintained, and an operating method of the storage device.

A storage device refers to a device that stores data under control of a host device, such as a computer, a smartphone, or a smart pad. The storage device includes a device which stores data on a magnetic disk, such as a hard disk drive (HDD), or a device which stores data in a semiconductor memory, in particular, a nonvolatile memory, such as a solid state drive (SSD) or a memory card.

A nonvolatile memory includes a read only memory (ROM), a programmable ROM (PROM), an electrically programmable ROM (EPROM), an electrically erasable and programmable ROM (EEPROM), a flash memory, a phase-change random access memory (PRAM), a magnetic RAM (MRAM), a resistive RAM (RRAM), a ferroelectric RAM (FRAM), etc.

With the development of semiconductor manufacturing technologies, the degree of integration of the storage device and a volume thereof continue to increase. The high degree of integration of the storage device makes it possible to reduce costs necessary to manufacture the storage device. However, the high degree of integration of the storage device causes the scale-down and structure change of the storage device, thereby causing various new issues. New issues cause a damage of data stored in the storage device. This may mean that the reliability of the storage device is reduced.

Various reliability check methods may be used to prevent the reliability of the storage device from being reduced. However, because the introduction of reliability check methods requires an additional time for executing the reliability check method, the latency of the storage device may increase or the throughput thereof may decrease.

SUMMARY

Embodiments of the present disclosure provide a storage device capable of reducing a time necessary for a check read operation while securing reliability through the check read operation and an operating method of the storage device.

According to an embodiment, a storage device includes a nonvolatile memory device that includes a plurality of memory blocks and a memory controller. Each of the plurality of memory blocks includes a plurality of cell strings, each including at least one ground selection transistor, two or more memory cells, and at least one string selection transistor stacked on a substrate in a direction perpendicular to the substrate. In a memory block selected from the plurality of memory blocks, the memory controller allows the nonvolatile memory device to perform a read operation on memory cells belonging to a selected page from among the plurality of memory cells in the plurality of cell strings. After the read operation, in the selected memory block, the memory controller allows the nonvolatile memory device to perform a first check read operation on memory cells of a first neighbor page associated with the selected page while sequentially selecting sets of read voltages. After the first check read operation, in the selected memory block, the memory controller allows the nonvolatile memory device to perform a second check read operation on memory cells of a second neighbor page associated with the selected page while sequentially selecting the sets of read voltages. In the second check read operation, the memory controller first selects a set of read voltages, which are used in the first check read operation in which error correction succeeds, from among the sets of read voltages.

According to an embodiment, an operating method is disclosed for a storage device which includes a nonvolatile memory device and a memory controller. The nonvolatile memory device includes a plurality of memory cells arranged on a substrate in rows and columns and stacked in a direction perpendicular to the substrate. The method includes receiving, at the memory controller, a read request from an external host device; performing, at the storage device, a read operation on selected memory cells of the nonvolatile memory device in response to the read request; performing, at the storage device, a first check read operation on first neighbor memory cells of the selected memory cells of the nonvolatile memory device while sequentially selecting sets of read voltages; performing, at the storage device, a second check read operation on second neighbor memory cells of the selected memory cells of the nonvolatile memory device while sequentially selecting the sets of read voltages; and first selecting, at the storage device, a set of read voltages which are used in the first check read operation in which error correction succeeds, from among the sets of read voltages, in the second check read operation.

According to an embodiment, an operating method is disclosed for a storage device which includes a nonvolatile memory device and a memory controller. The nonvolatile memory device includes a plurality of memory cells arranged on a substrate in rows and columns and stacked in a direction perpendicular to the substrate. The method includes receiving, at the memory controller, a read request from an external host device; performing, at the storage device, a read operation on selected memory cells of the nonvolatile memory device in response to the read request; performing, at the storage device, a first check read operation on first neighbor memory cells of the selected memory cells of the nonvolatile memory device while sequentially selecting sets of read voltages; and performing, at the storage device, a second check read operation on second neighbor memory cells of the selected memory cells of the nonvolatile memory device while sequentially selecting the sets of read voltages. In the second check read operation, the storage device first selects a set of read voltages, which are used in the first check read operation in which error correction succeeds, from among the sets of read voltages. The performing of the read operation includes transmitting, at the memory controller, a first read command to the nonvolatile memory device; performing, at the nonvolatile memory device, the read operation by using first read voltages in response to the first read command, such that first data read through the read operation are transmitted to the memory controller; performing, at the memory controller, error correction decoding on the first data; transmitting, at the memory controller, the error correction decoded first data to the external host device in response to determining that the error correction decoding succeeds; and transmitting, at the memory controller, the first read command and first voltage information to the nonvolatile memory device in response to determining that the error correction decoding fails. The performing of the first check read operation includes transmitting, at the memory controller, a second read command to the nonvolatile memory device; performing, at the nonvolatile memory device, a read operation by using one set of read voltages among the sets of read voltages in response to the second read command, such that second data read through the read operation are transmitted to the memory controller; performing, at the memory controller, the error correction decoding on the second data; terminating, at the memory controller, the first check read operation in response to determining that the error correction decoding succeeds; and transmitting, at the memory controller, the second read command and second voltage information indicating a next set of read voltages among the sets of read voltages to the nonvolatile memory device in response to determining that the error correction decoding fails. The performing of the second check read operation includes transmitting, at the memory controller and to the nonvolatile memory device, a third read command and third voltage information which indicates a set of read voltages used in the first check read operation and for which the error correction succeeds; performing, at the nonvolatile memory device, a read operation by using the set of read voltages which are used in the first check read operation and for which the error correction succeeds, from among the sets of read voltages in response to the third read command, such that third data read through the read operation are transmitted to the memory controller; performing, at the memory controller, the error correction decoding on the third data; and terminating, at the memory controller, the second check read operation in response to determining that the error correction decoding succeeds.

BRIEF DESCRIPTION OF THE FIGURES

The above and other objects and features of the present disclosure will become apparent by describing in detail embodiments thereof with reference to the accompanying drawings.

DETAILED DESCRIPTION

Below, embodiments of the present disclosure may be described in detail and clearly to such an extent that an ordinary one in the art easily implements the present disclosure. Below, the term "and/or" is interpreted as including any one of items listed with regard to the term, or a combination of some of the listed items.

Figure 1:
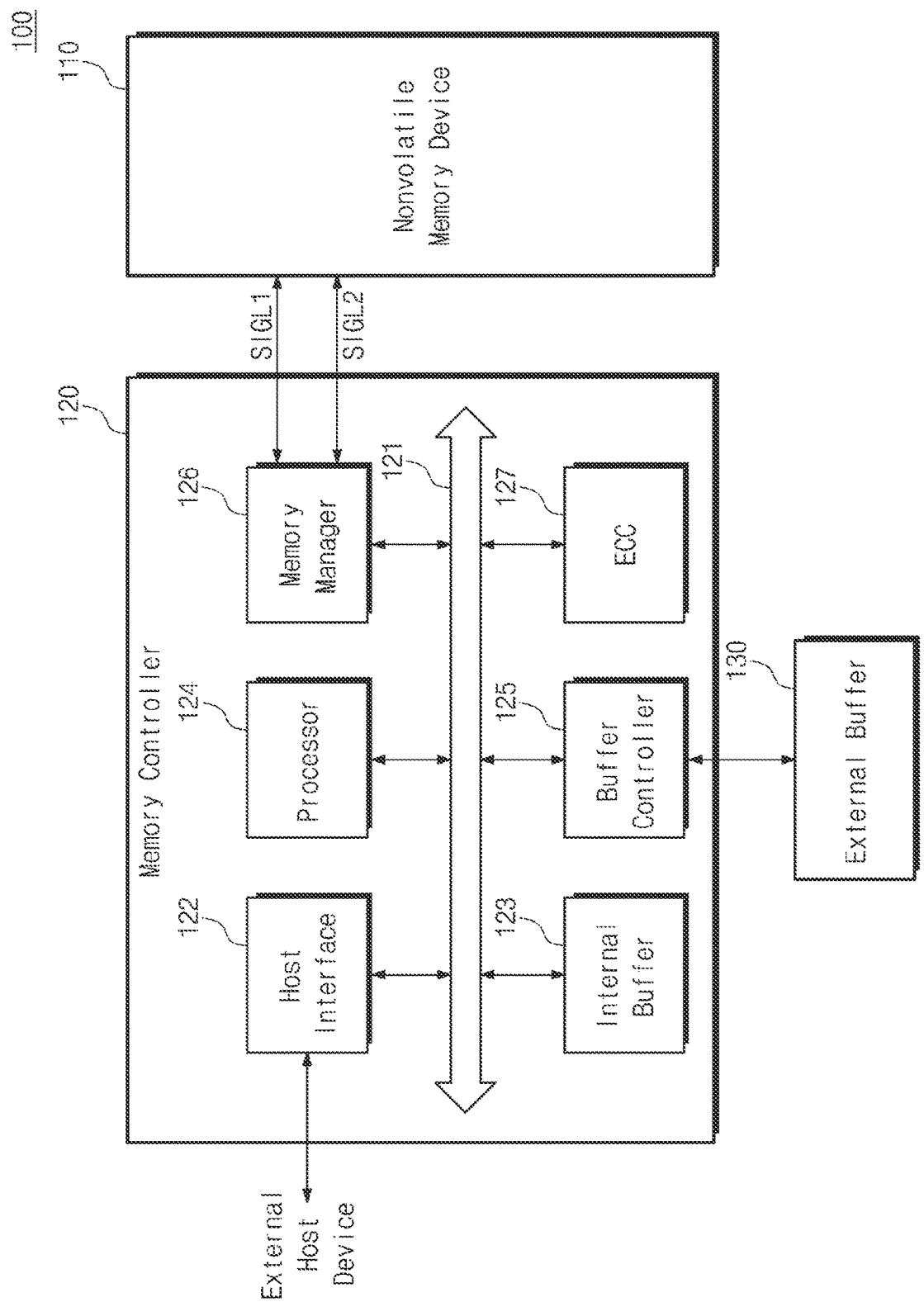
FIG. 1 illustrates a storage device according to an embodiment of the present disclosure.

FIG. 1 illustrates a storage device 100 according to an embodiment of the present disclosure. Referring to FIG. 1, the storage device 100 may include a nonvolatile memory device 110, a memory controller 120, and an external buffer 130. The nonvolatile memory device 110 may include a plurality of memory cells. Each of the plurality of memory cells may store two or more bits.

For example, the nonvolatile memory device 110 may include at least one of various nonvolatile memory devices such as a flash memory device, a phase change memory device, a ferroelectric memory device, a magnetic memory device, and a resistive memory device.

The memory controller 120 may receive various requests for writing data in the nonvolatile memory device 110 or reading data from the nonvolatile memory device 110 from an external host device. The memory controller 120 may store (or buffer) user data transmitted/received to/from the external host device in the external buffer 130 and may store metadata for managing the storage device 100 in the external buffer 130.

The memory controller 120 may access the nonvolatile memory device 110 through first signal lines SIGL1 and second signal lines SIGL2. For example, the memory controller 120 may transmit a command and an address to the nonvolatile memory device 110 through the first signal lines SIGL1. The memory controller 120 may exchange data with the nonvolatile memory device 110 through the first signal lines SIGL1.

The memory controller 120 may transmit a first control signal to the nonvolatile memory device 110 through the second signal lines SIGL2. The memory controller 120 may receive a second control signal from the nonvolatile memory device 110 through the second signal lines SIGL2.

In an embodiment, the memory controller 120 may be configured to control two or more nonvolatile memory devices. The memory controller 120 may provide first signal lines and second signal lines for each of the two or more nonvolatile memory devices.

As another example, the memory controller 120 may provide first signal lines so as to be shared by the two or more nonvolatile memory devices. The memory controller 120 may provide some of the second signal lines so as to be shared by the two or more nonvolatile memory devices and may separately provide the others thereof.

The external buffer 130 may include a random access memory. For example, the external buffer 130 may include at least one of a dynamic random access memory, a phase change random access memory, a ferroelectric random access memory, a magnetic random access memory, and a resistive random access memory.

The memory controller 120 may include a bus 121, a host interface 122, an internal buffer 123, a processor 124, a buffer controller 125, a memory manager 126, and an error correction code (ECC) block 127.

The bus 121 may provide communication channels between the components in the memory controller 120. The host interface 122 may receive various requests from the external host device and may parse the received requests. The host interface 122 may store the parsed requests in the internal buffer 123.

The host interface 122 may transmit various responses to the external host device. The host interface 122 may exchange signals with the external host device in compliance with a given communication protocol. The internal buffer 123 may include a random access memory. For example, the internal buffer 123 may include a static random access memory or a dynamic random access memory.

The processor 124 may drive an operating system or firmware for an operation of the memory controller 120. The processor 124 may read the parsed requests stored in the internal buffer 123 and may generate commands and addresses for controlling the nonvolatile memory device 110. The processor 124 may provide the generated commands and addresses to the memory manager 126.

The processor 124 may store various metadata for managing the storage device 100 in the internal buffer 123. The processor 124 may access the external buffer 130 through the buffer controller 125. The processor 124 may control the buffer controller 125 and the memory manager 126 such that user data stored in the external buffer 130 are provided to the nonvolatile memory device 110.

The processor 124 may control the host interface 122 and the buffer controller 125 such that the data stored in the external buffer 130 are provided to the external host device. The processor 124 may control the buffer controller 125 and the memory manager 126 such that data received from the nonvolatile memory device 110 are stored in the external buffer 130. The processor 124 may control the host interface 122 and the buffer controller 125 such that data received from the external host device are stored in the external buffer 130.

Under control of the processor 124, the buffer controller 125 may write data in the external buffer 130 or may read data from the external buffer 130. The memory manager 126 may communicate with the nonvolatile memory device 110 through the first signal lines SIGL1 and the second signal lines SIGL2 under control of the processor 124.

The memory manager 126 may access the nonvolatile memory device 110 under control of the processor 124. For example, the memory manager 126 may access the nonvolatile memory device 110 through the first signal lines SIGL1 and the second signal lines SIGL2. The memory manager 126 may communicate with the nonvolatile memory device 110, based on a protocol that is defined in compliance with the standard or is defined by a manufacturer.

The error correction code block 127 may perform error correction encoding on data to be provided to the nonvolatile memory device 110 by using an error correction code (ECC). The error correction code block 127 may perform error correction decoding on data received from the nonvolatile memory device 110 by using the error correction code (ECC).

In an embodiment, the storage device 100 may not include the external buffer 130 and the buffer controller 125. When the external buffer 130 and the buffer controller 125 are not included in the storage device 100, the above functions of the external buffer 130 and the buffer controller 125 may be performed by the internal buffer 123.

Figure 2:
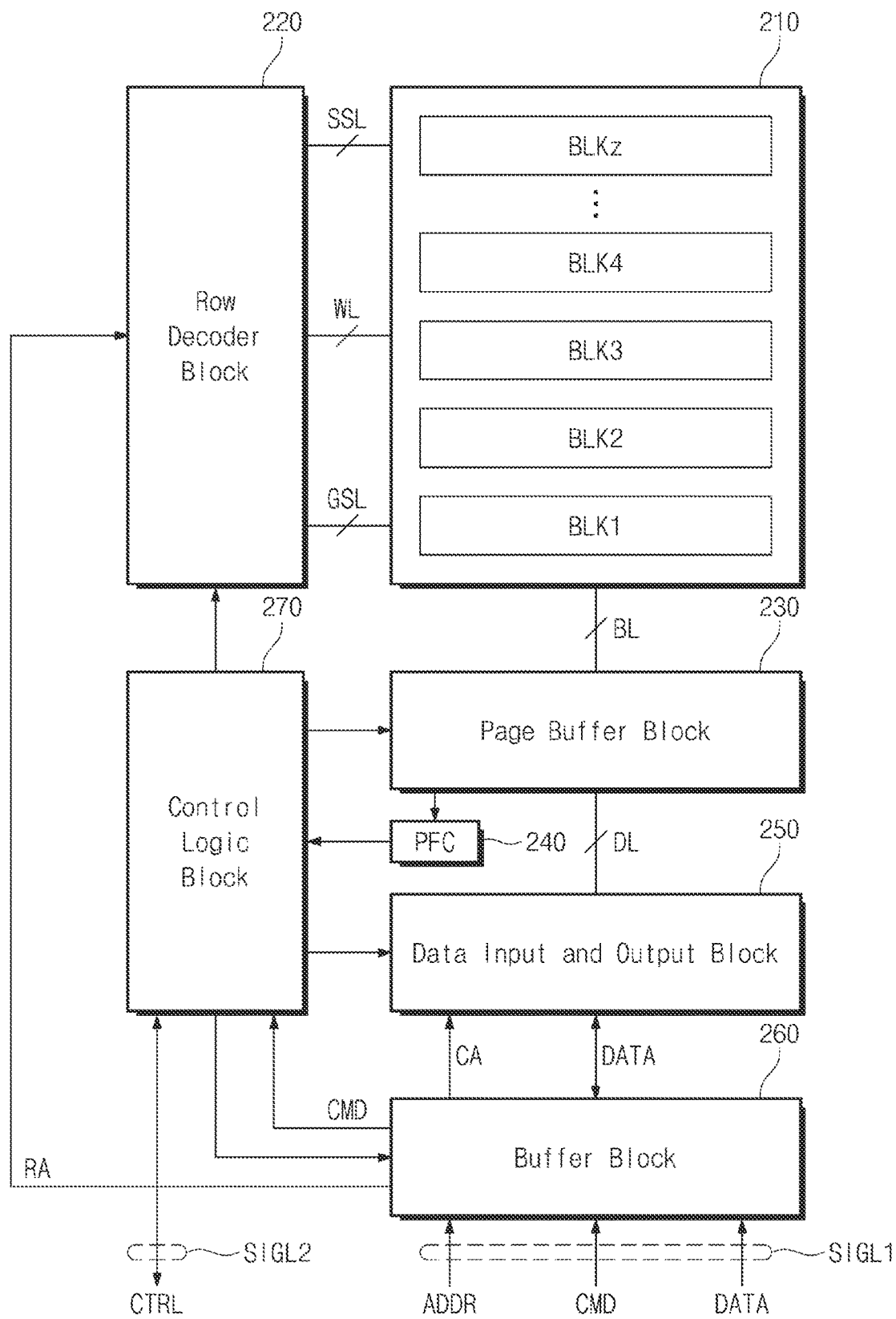
FIG. 2 is a block diagram illustrating a nonvolatile memory device according to an embodiment of the present disclosure.

FIG. 2 is a block diagram illustrating a nonvolatile memory device 200 according to an embodiment of the present disclosure. Referring to FIG. 2, the nonvolatile memory device 200 includes a memory cell array 210, a row decoder block 220, a page buffer block 230, a pass/fail check block (PFC) 240, a data input and output block 250, a buffer block 260, and a control logic block 270.

The memory cell array 210 includes a plurality of memory blocks BLK1 to BLKz. Each of the memory blocks BLK1 to BLKz includes a plurality of memory cells. Each of the memory blocks BLK1 to BLKz may be connected with the row decoder block 220 through one or more ground selection lines GSL, word lines WL, and one or more string selection lines SSL. Some of the word lines WL may be used as dummy word lines. Each of the memory blocks BLK1 to BLKz may be connected with the page buffer block 230 through a plurality of bit lines BL. The plurality of memory blocks BLK1 to BLKz may be connected in common with the plurality of bit lines BL.

In an embodiment, each of the plurality of memory blocks BLK1 to BLKz may be a unit of an erase operation. Memory cells belonging to each of the memory blocks BLK1 to BLKz may be erased at the same time. As another example, each of the memory blocks BLK1 to BLKz may be divided into a plurality of sub-blocks. Each of the plurality of sub-blocks may correspond to a unit of the erase operation.

The row decoder block 220 is connected with the memory cell array 210 through the ground selection lines GSL, the word lines WL, and the string selection lines SSL. The row decoder block 220 operates under control of the control logic block 270.

The row decoder block 220 may decode a row address RA received from the buffer block 260 and may control voltages to be applied to the string selection lines SSL, the word lines WL, and the ground selection lines GSL based on the decoded row address.

The page buffer block 230 is connected with the memory cell array 210 through the plurality of bit lines BL. The page buffer block 230 is connected with the data input and output block 250 through a plurality of data lines DL. The page buffer block 230 operates under control of the control logic block 270.

In a program operation, the page buffer block 230 may store data to be written in memory cells. The page buffer block 230 may apply voltages to the plurality of bit lines BL based on the stored data. In a read operation or in a verify read operation that is performed in the program operation or the erase operation, the page buffer block 230 may sense voltages of the bit lines BL and may store a sensing result.

In the verify read operation associated with the program operation or the erase operation, the pass/fail check block 240 may verify the sensing result of the page buffer block 230. For example, in the verify read operation associated with the program operation, the pass/fail check block 240 may count the number of values (e.g., the number of 0s) respectively corresponding to on-cells that are not programmed to a target threshold voltage or more.

In the verify read operation associated with the erase operation, the pass/fail check block 240 may count the number of values (e.g., the number of 1s) respectively corresponding to off-cells that are not erased to a target threshold voltage or less. When a counting result is greater than or equal to a threshold value, the pass/fail check block 240 may output a signal indicating a fail to the control logic block 270. When the counting result is smaller than the threshold value, the pass/fail check block 240 may output a signal indicating a pass to the control logic block 270. Depending on a verification result of the pass/fail check block 240, a program loop of the program operation may be further performed or an erase loop of the erase operation may be further performed.

The data input and output block 250 is connected with the page buffer block 230 through the plurality of data lines DL. The data input and output block 250 may receive a column address CA from the buffer block 260. The data input and output block 250 may output data read by the page buffer block 230 to the buffer block 260 depending on the column address CA. The data input and output block 250 may provide data received from the buffer block 260 to the page buffer block 230, based on the column address CA.

Through the first signal lines SIGL1, the buffer block 260 may receive a command CMD and an address ADDR from an external device and may exchange data "DATA" with the external device. The buffer block 260 may operate under control of the control logic block 270. The buffer block 260 may provide the command CMD to the control logic block 270. The buffer block 260 may provide the row address RA of the address ADDR to the row decoder block 220 and may provide the column address CA of the address ADDR to the data input and output block 250. The buffer block 260 may exchange the data "DATA" with the data input and output block 250.

The control logic block 270 may exchange a control signal CTRL with the external device through the second signal lines SIGL2. The control logic block 270 may allow the buffer block 260 to route the command CMD, the address ADDR, and the data "DATA". The control logic block 270 may decode the command CMD received from the buffer block 260 and may control the nonvolatile memory device 200 based on the decoded command.

In an embodiment, the nonvolatile memory device 200 may be manufactured in a bonding manner. The memory cell array 210 may be manufactured at a first wafer, and the row decoder block 220, the page buffer block 230, the data input and output block 250, the buffer block 260, and the control logic block 270 may be manufactured at a second wafer. The nonvolatile memory device 200 may be implemented by coupling the first wafer and the second wafer such that an upper surface of the first wafer and an upper surface of the second wafer face each other.

As another example, the nonvolatile memory device 200 may be manufactured in a cell over peri (COP) manner A peripheral circuit including the row decoder block 220, the page buffer block 230, the data input and output block 250, the buffer block 260, and the control logic block 270 may be implemented on a substrate. The memory cell array 210 may be implemented over the peripheral circuit. The peripheral circuit and the memory cell array 210 may be connected by using through vias.

Figure 3:
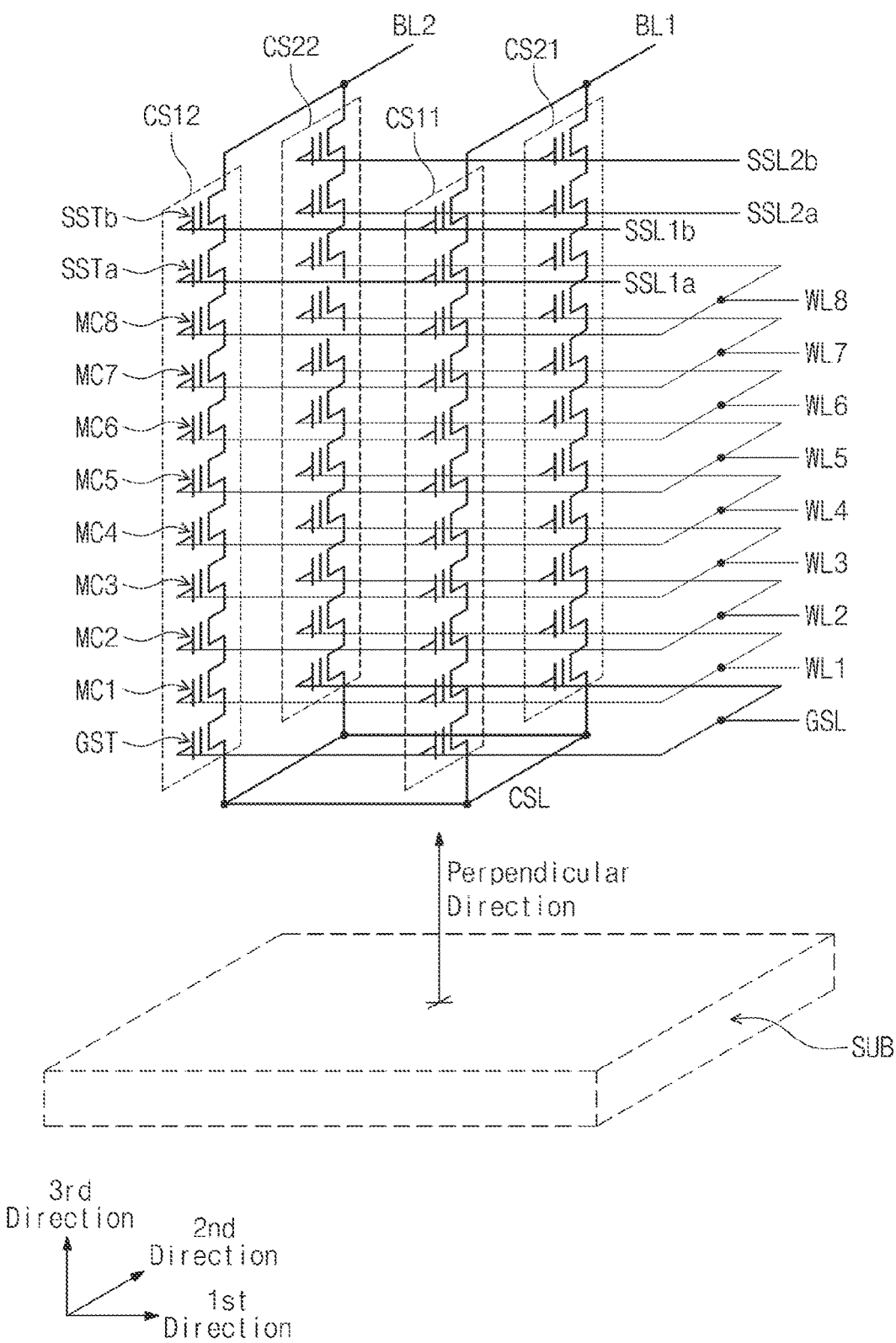
FIG. 3 is a circuit diagram illustrating an example of one memory block of memory blocks of FIG. 2.

FIG. 3 is a circuit diagram illustrating an example of one memory block BLKa of the memory blocks BLK1 to BLKz of FIG. 2. Referring to FIG. 3, a plurality of cell strings CS11, CS12, CS21, and CS22 may be arranged on a substrate SUB in rows and columns. Each row may extend in a first direction. Each column may extend in a second direction. The plurality of cell strings CS11, CS12, CS21, and CS22 may be connected in common with a common source line CSL formed on (or in) the substrate SUB. In FIG. 3, a location of the substrate SUB is depicted as an example for better understanding of the structure of the memory block BLKa.

Cell strings of each row may be connected in common with the ground selection line GSL and may be connected with corresponding string selection lines of first string selection lines SSL1a and SSL1b and second string selection lines SSL2a and SSL2b. Cell strings of each column may be connected with a corresponding bit line of first and second bit lines BL1 and BL2.

Each cell string may include at least one ground selection transistor GST connected with the ground selection line GSL and a plurality of memory cells MC1 to MC8 respectively connected with a plurality of word lines WL1 to WL8. Cell strings of a first row may further include string selection transistors SSTa and SSTb connected with the first string selection lines SSL1a and SSL1b. Cell strings of a second row may further include string selection transistors SSTa and SSTb connected with the second string selection lines SSL2a and SSL2b.

In each cell string, the ground selection transistor GST, the memory cells MC1 to MC8, and the string selection transistors SSTa and SSTb may be connected in series in a direction perpendicular to the substrate SUB, for example, a third direction and may be sequentially stacked in the direction perpendicular to the substrate SUB. In each of the cell strings CS11, CS12, CS21, and CS22, at least one of the memory cells MC1 to MC8 may be used as a dummy memory cell. The dummy memory cell may not be programmed (e.g., may be program-inhibited) or may be programmed differently from the remaining memory cells of the memory cells MC1 to MC8 other than the dummy memory cell.

In an embodiment, memory cells that are placed at the same height and are associated with one string selection line SSL1a, SSL1b, SSL2a, or SSL2b may form one physical page. Memory cells constituting one physical page may be connected with one sub-word line. Sub-word lines of physical pages located at the same height may be connected in common with one word line. Below, the term "word line" may be used to indicate a word line or a sub-word line and may be interpreted based on the context.

An embodiment in which the memory block BLKa includes the cell strings CS11, CS12, CS21, and CS22 at intersections of a first row corresponding to the first string selection lines SSL1a or SSL1b, a second row corresponding to the second string selection lines SSL2a or SSL2b, a first column corresponding to the first bit line BL, and a second column corresponding to the second bit line BL2 is illustrated, but rows and columns of cell strings included in the memory block BLKa are not limited in number.

Figure 4:
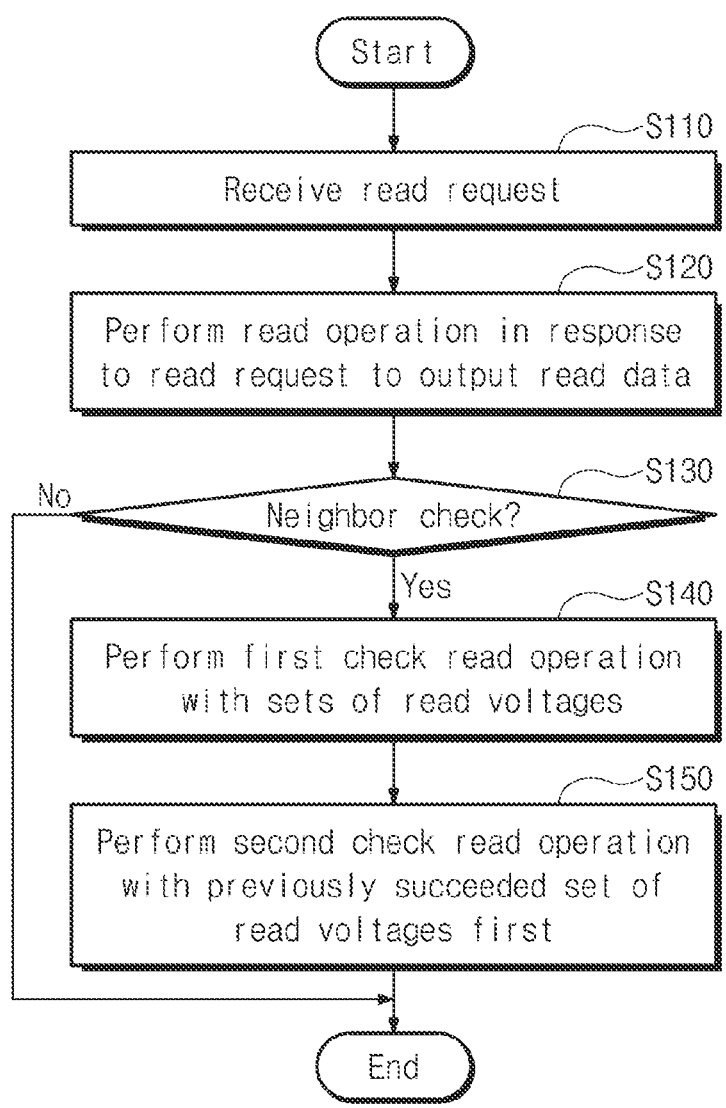
FIG. 4 illustrates an example of an operating method of a storage device according to an embodiment of the present disclosure.

FIG. 4 illustrates an operating method of the storage device 100 according to an embodiment of the present disclosure. Referring to FIGS. 1, 2, 3 and 4, in operation S110, the memory controller 120 of the storage device 100 may receive a read request from the external host device.

In operation S120, in response to the read request, the memory controller 120 of the storage device 100 may allow the nonvolatile memory device 110 to perform a read operation. The nonvolatile memory device 110 may transmit the read data to the memory controller 120. The memory controller 120 may output, to the external host device, the data transmitted from the nonvolatile memory device 110 (i.e., the data read in response to the read request).

In operation S130, the memory controller 120 may perform a neighbor check operation. For example, the processor 124 of the memory controller 120 may perform a check read operation (e.g., as the neighbor check operation) on the nonvolatile memory device 110. The processor 124 of the memory controller 120 may internally generate random numbers. The processor 124 of the memory controller 120 may generate a random number for each of the memory blocks BLK1 to BLKz.

The processor 124 of the memory controller 120 may count the number of times of the read operation performed on each memory block. When the read operation is not performed on a specific memory block a number of times equal to a random number, the processor 124 of the memory controller 120 may determine that there is no need to perform the check read operation on the nonvolatile memory device 110. Accordingly, the processor 124 of the memory controller 120 may terminate the process according to the read request.

When the read operation is performed on the specific memory block the number of times equal to the random number, the processor 124 of the memory controller 120 may determine that there is a need to perform the check read operation on the nonvolatile memory device 110. Accordingly, in operation S140 and operation S150, the storage device 100 may perform the check read operation.

In operation S140, the memory controller 120 may allow the nonvolatile memory device 110 to perform a first check read operation by using sets of read voltages. For example, the memory controller 120 may allow the nonvolatile memory device 110 to perform the check read operation on first neighbor memory cells of a first neighbor page associated with the page selected for the read operation in operation S120, which will be described in detail later. For example, a neighbor page and neighbor memory cells may include a page and memory cells belonging to the same memory block.

For example, the storage device 100 may perform the first check read operation while sequentially selecting the sets of read voltages from an initial set among the sets of read voltages. When the first check read operation using the sets of read voltages succeeds (e.g., an error of the read data is successfully corrected), the first check read operation may end.

In operation S150, the memory controller 120 may allow the nonvolatile memory device 110 to perform a second check read operation by using the sets of read voltages. For example, the memory controller 120 may allow the nonvolatile memory device 110 to perform the check read operation on second neighbor memory cells of a second neighbor page associated with the page selected for the read operation in operation S120, which will be described in detail later. For example, a neighbor page and neighbor memory cells may include a page and memory cells belonging to the same memory block.

For example, the storage device 100 may first select a set of read voltages, which corresponds to the previous error correction success (e.g., which are used in the first check read operation in which error correction succeeds), from among the sets of read voltages. When the second check read operation using the sets of read voltages succeeds (e.g., an error of the read data is successfully corrected), the second check read operation may end.

In an embodiment, when the first check read operation and the second check read operation succeed, the processor 124 of the memory controller 120 may determine that the reliability of data stored in memory cells of the corresponding memory block is high. In this case, the processor 124 of the memory controller 120 may terminate the check read operation.

When the first check read operation and/or the second check read operation fails, the processor 124 of the memory controller 120 may determine that the reliability of the data stored in the memory cells of the corresponding memory block is low. In this case, the processor 124 of the memory controller 120 may select the corresponding memory block as a target of a read reclaim operation. The read reclaim operation may refer to an operation of improving the reliability of data by reading data of a first memory block (e.g., a target memory block of the read reclaim operation) and writing the read data in a second memory block (e.g., a memory block of an erase state).

In an embodiment, the processor 124 of the memory controller 120 may allow the nonvolatile memory device 110 to immediately perform the read reclaim operation on the corresponding memory block. As another example, the processor 124 of the memory controller 120 may schedule the read reclaim operation of the corresponding memory block so as to be performed later (e.g., during an idle time).

In an embodiment, the description is given for the circumstance in which the storage device 100 performs the check read operation in response to the read request from the external host device. However, the memory controller 120 may perform various background operations for managing the nonvolatile memory device 110 and the storage device 100 and the background operations may cause the read operation of the nonvolatile memory device 110. The read operation associated with the background operation may also cause the check read operation.

Figure 5:
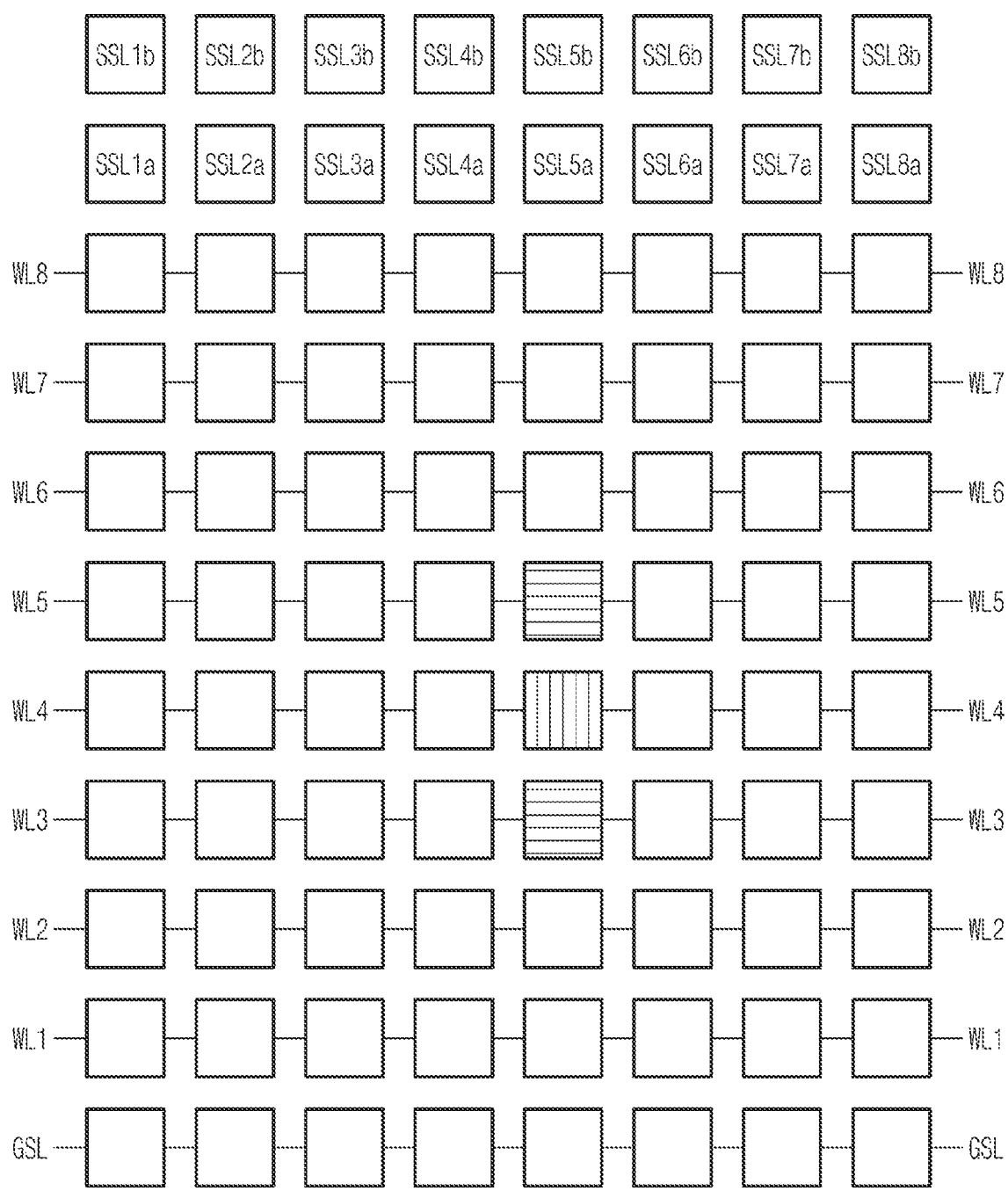
FIG. 5 illustrates a first example of neighbor memory cells of a neighbor page.

FIG. 5 illustrates a first example of neighbor memory cells of a neighbor page. Neighbor memory cells of a neighbor page will be described with reference to FIGS. 1, 2, 3, 4, and 5. An example of the memory block BLKa when viewed in a direction facing away from the first direction is illustrated in FIG. 5.

Eight (8) rows corresponding to first string selection lines SSL1a and SSL1b, second string selection lines SSL2a and SSL2b, third string selection lines SSL3a and SSL3b, fourth string selection lines SSL4a and SSL4b, fifth string selection lines SSL5a and SSL5b, sixth string selection lines SSL6a and SSL6b, seventh string selection lines SSL7a and SSL7b, and eighth string selection lines SSL8a and SSL8b are illustrated in FIG. 5.

Each of squares connected with the first to eighth word lines WL1 to WL8 may indicate one page and may correspond to a plurality of memory cells. Memory cells, the number of which corresponds to the number of columns, may be included in the squares, respectively. Each of squares connected with the ground selection line GSL may indicate a set of ground selection transistors GST. The ground selection transistors GST, the number of which corresponds to the number of columns, may be included in the squares, respectively.

A neighbor page of neighbor memory cell may belong to the same memory block as a selected page of selected memory cells. For example, a square filled with vertical lines may indicate a selected page of selected memory cells.

Squares filled with horizontal lines may indicate candidate pages to be selected as a neighbor page. For example, a page of memory cells immediately placed above the selected page of memory cells (e.g., a page of memory cells the closest to the selected page in the third direction) and a page of memory cells page immediately placed below the selected page of memory cells (e.g., a page of memory cells the closest to the selected page in a direction facing away from the third direction) may be selected as a neighbor page of neighbor memory cells.

The processor 124 of the memory controller 120 may randomly select one of the page (hereinafter referred to as a "vertically immediately placed upper page") immediately placed above the selected page and the page (hereinafter referred to as a "vertically immediately placed lower page") immediately placed below the selected page. The memory controller 120 may allow the nonvolatile memory device 110 to perform the check read operation on the neighbor page of neighbor memory cells randomly selected.

Figure 6:
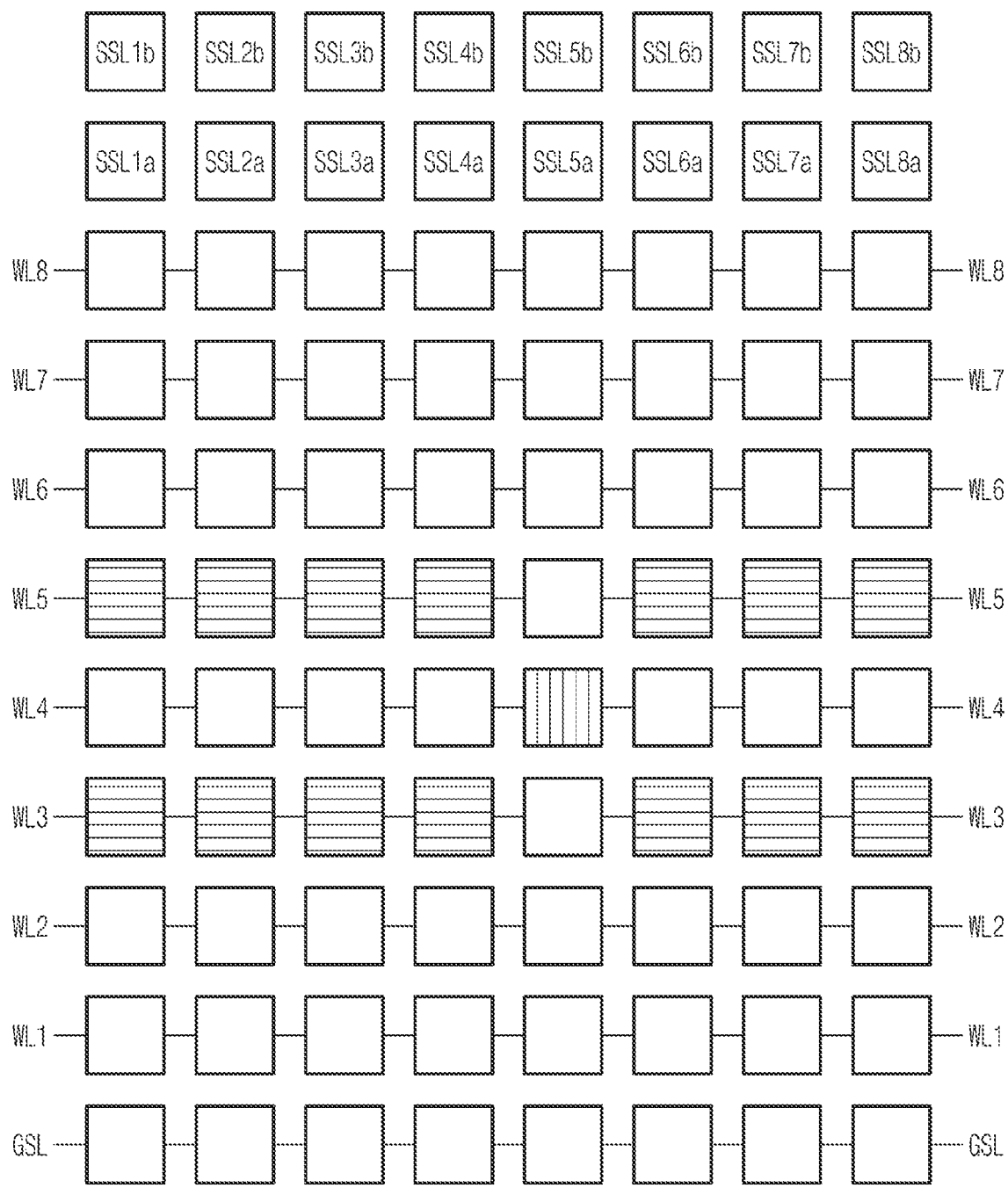
FIG. 6 illustrates a second example of neighbor memory cells of a neighbor page.

FIG. 6 illustrates a second example of neighbor memory cells of a neighbor page. Squares are implemented as described with reference to FIG. 5, and thus, additional description will be omitted to avoid redundancy.

Referring to FIGS. 1, 2, 3, 4, and 6, a neighbor page of neighbor memory cell may belong to the same memory block as a selected page of selected memory cells. For example, a square filled with vertical lines may indicate a selected page of selected memory cells.

Squares filled with horizontal lines may indicate candidate pages to be selected as a neighbor page. For example, the remaining pages (e.g., first upper pages) of memory cells other than a vertically immediately placed upper page among pages (e.g., upper pages) placed above the selected page of memory cells and the remaining pages (e.g., first lower pages) of memory cells other than a vertically immediately placed lower page among pages (e.g., lower pages) placed below the selected page of memory cells may be selected as neighbor pages of neighbor memory cells.

The processor 124 of the memory controller 120 may randomly select one of the first upper pages and the first lower pages. For the check read operation, the memory controller 120 may randomly select string selection lines belonging to one row from among the remaining string selection lines SSL1a, SSL1b, SSL2a, SSL2b, SSL3a, SSL3b, SSL4a, SSL4b, SSL6a, SSL6b, SSL7a, SSL7b, SSL8a, and SSL8b other than the selected string selection lines SSL5a and SSL5b corresponding to the selected page.

The memory controller 120 may randomly select one of an upper page and a lower page of a row selected for the check read operation as a neighbor page for the check read operation. The memory controller 120 may allow the nonvolatile memory device 110 to perform the check read operation on the neighbor page of neighbor memory cells randomly selected.

Figure 7:
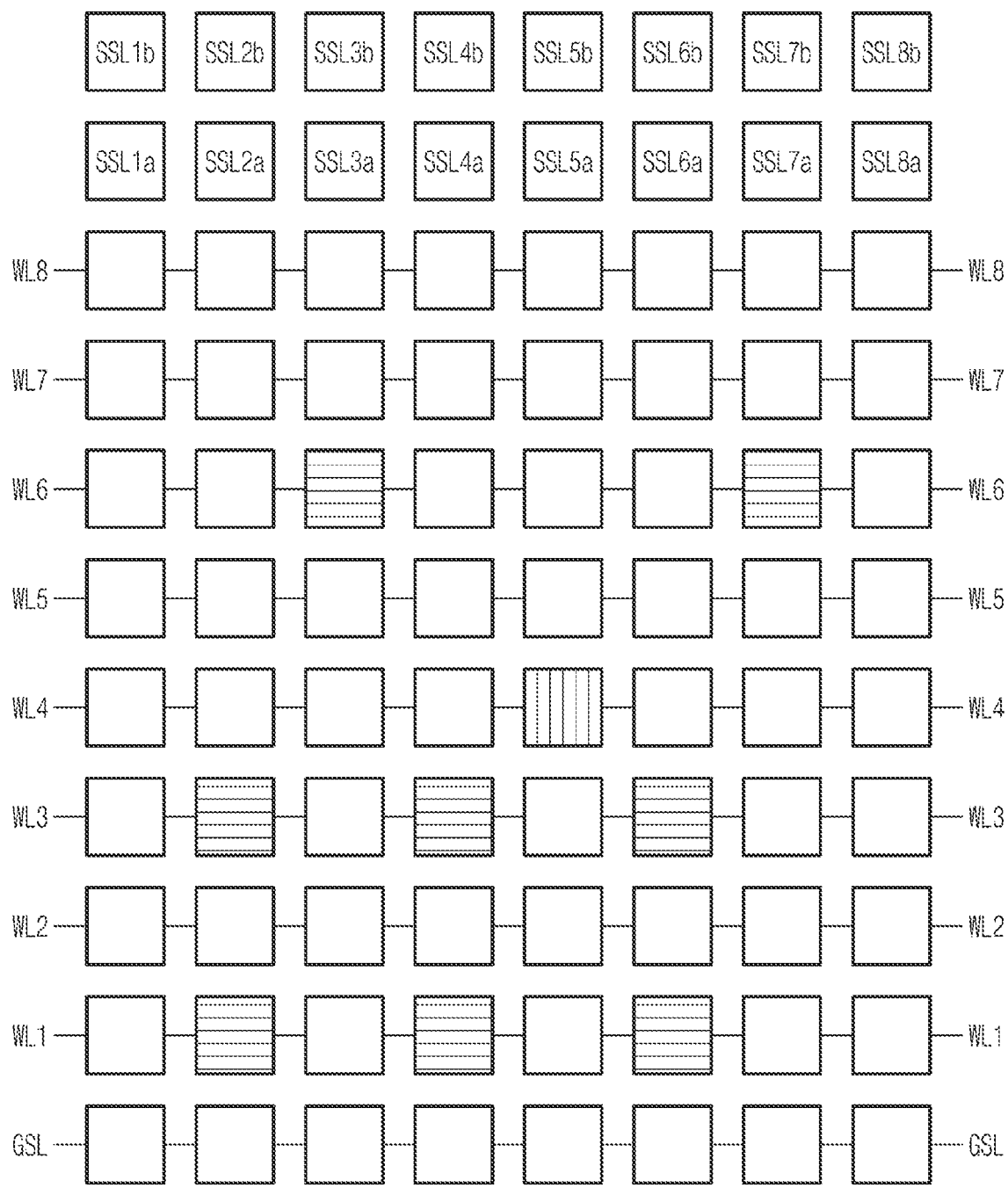
FIG. 7 illustrates a second example of neighbor memory cells of a neighbor page.

FIG. 7 illustrates a second example of neighbor memory cells of a neighbor page. Squares are implemented as described with reference to FIG. 5, and thus, additional description will be omitted to avoid redundancy.

Referring to FIGS. 1, 2, 3, 4, and 7, a neighbor page of a neighbor memory cell may belong to the same memory block as a selected page of selected memory cells. For example, a square filled with vertical lines may indicate a selected page of selected memory cells.

Squares filled with horizontal lines may be candidate pages to be selected as a neighbor page. For example, the memory controller 120 may store a list of addresses of pages including memory cells having low reliability from among memory cells. For example, the pages including the memory cells having the low reliability may be determined in the process of manufacturing the nonvolatile memory device 110. The address of the pages including the memory cells having the low reliability may be stored in the nonvolatile memory device 110 or nonvolatile storage of the memory controller 120 so as to be referenced by the memory controller 120.

The memory controller 120 may randomly select a page corresponding to one of the addresses in the list. The memory controller 120 may allow the nonvolatile memory device 110 to perform the check read operation on the neighbor page of neighbor memory cells randomly selected.

Figure 8:
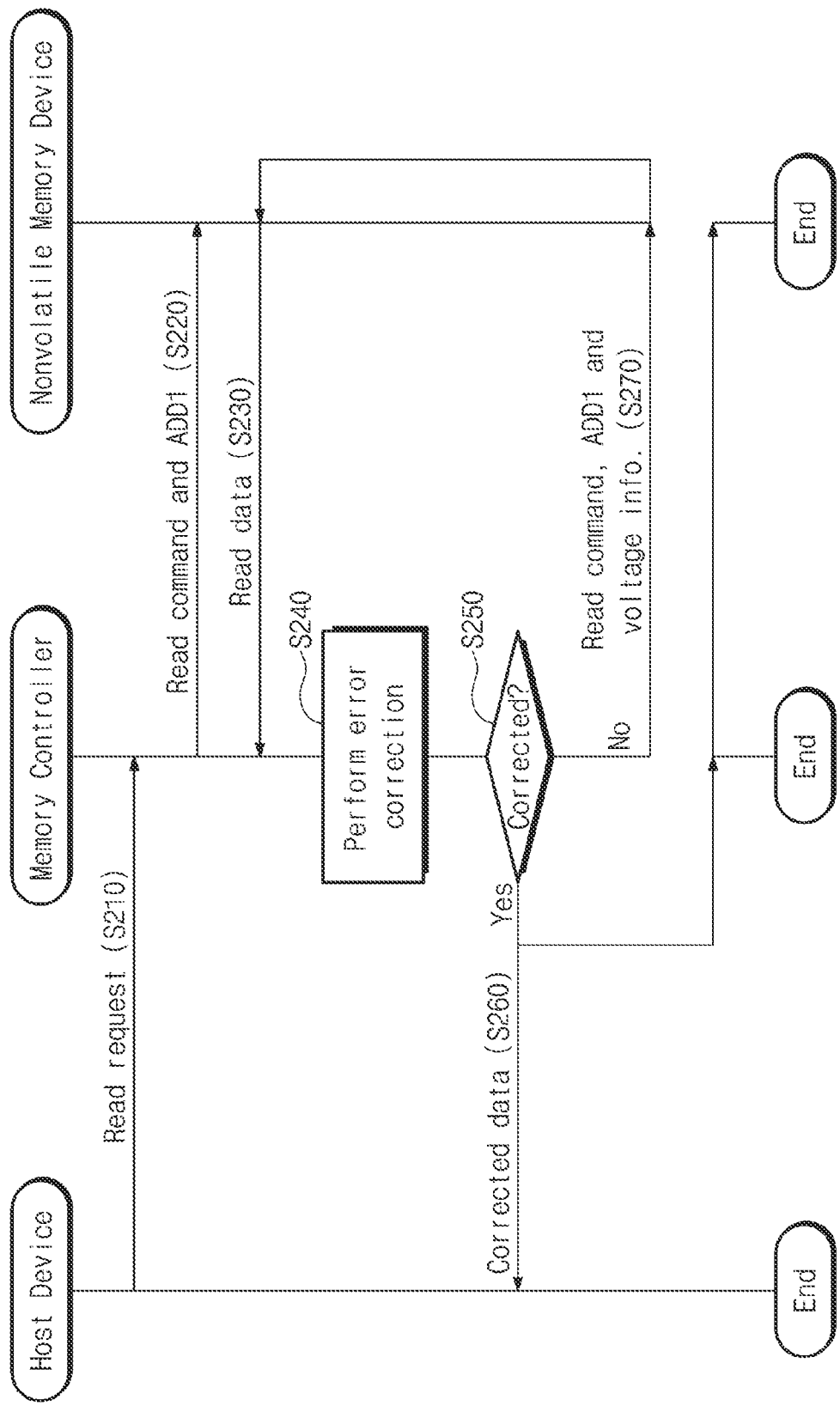
FIG. 8 illustrates an example of a process in which a storage device performs a read operation.

FIG. 8 illustrates an example of a process in which the storage device 100 performs the read operation. Referring to FIGS. 1 and 8, in operation S210, the memory controller 120 may receive the read request from the external host device.

In operation S220, in response to the read request being received from the external host device, the memory controller 120 may transmit a read command and a first address ADD1 to the nonvolatile memory device 110.

In operation S230, the nonvolatile memory device 110 may perform the read operation in response to the read command and the first address ADD1 and may transmit the read data to the memory controller 120.

In operation S240, the error correction code block 127 of the memory controller 120 may perform error correction decoding on the read data. In operation S250, the memory controller 120 may determine whether an error of the read data is corrected. When it is determined that the error of the read data is corrected, in operation S260, the memory controller 120 may output the error-corrected data to the external host device. Afterwards, the read operation may be terminated.

When it is determined that the error of the read data is not corrected, in operation S270, the memory controller 120 may transmit the read command, the first address ADD1, and voltage information to the nonvolatile memory device 110. The voltage information may include information of read voltages to be used in the read operation of the nonvolatile memory device 110. The nonvolatile memory device 110 may again perform the read operation by using the read voltages corresponding to the voltage information and may transmit the read data to the memory controller 120 in operation S230. Afterwards, operation S240 and operation S250 may again be performed.

A loop including operation S270, operation S230, operation S240, and operation S250 may be performed at least two times. When an error is not corrected even though the loop is performed the given number of times, the memory controller 120 may determine that an uncorrectable error is present in the data corresponding to the first address ADD1. The memory controller 120 may notify the external host device that an uncorrectable error occurs and may terminate the read operation.

Figure 9:
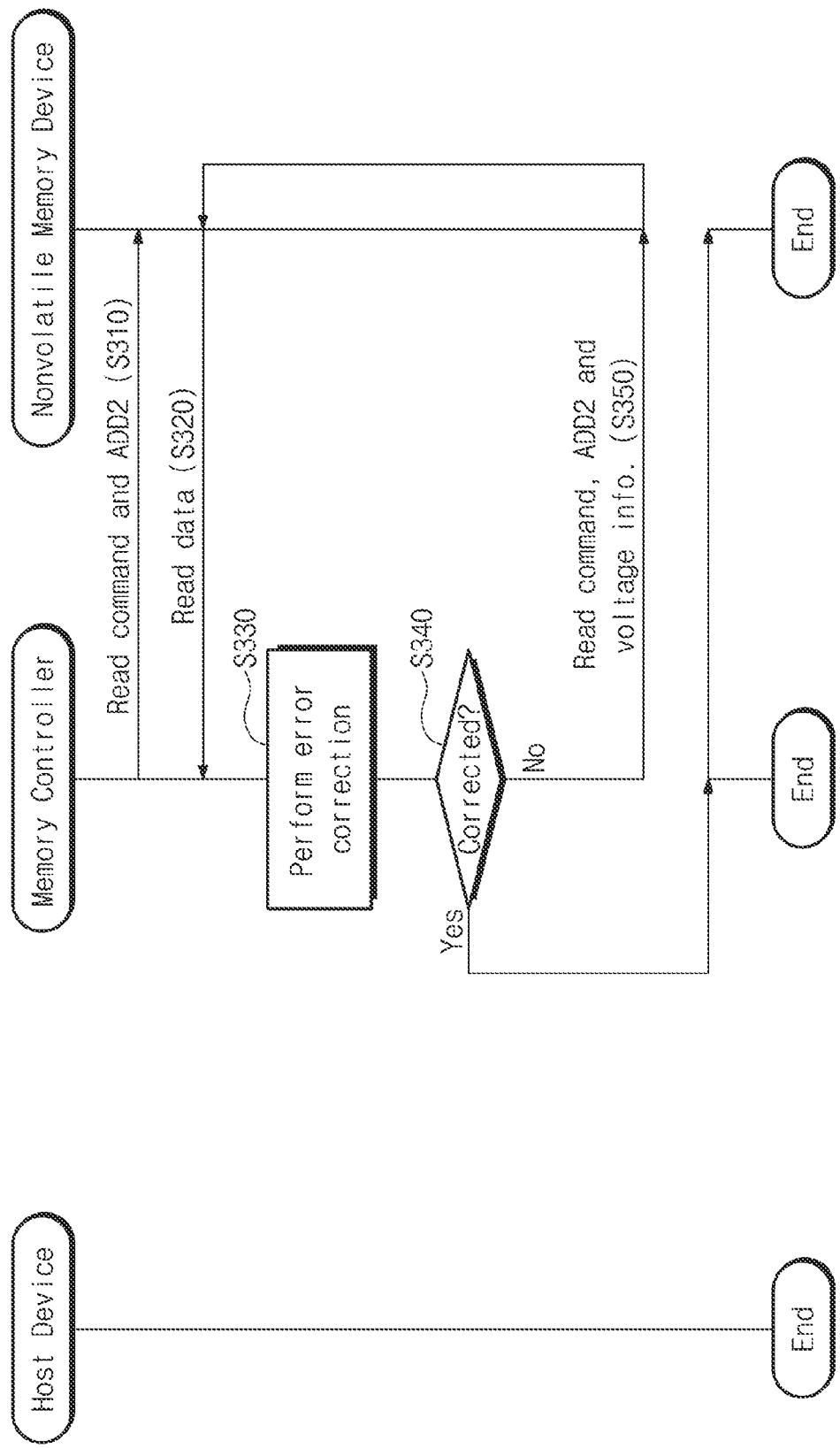
FIG. 9 illustrates an example of a process in which a storage device performs a first check read operation.

FIG. 9 illustrates an example of a process in which the storage device 100 performs a first check read operation. Referring to FIGS. 1 and 9, in operation S310, even though the read request is not received from the external host device, in response to determining that the number of read operations performed on a selected memory block reaches a random number, the memory controller 120 may transmit the read command and a second address ADD2 to the nonvolatile memory device 110.

In operation S320, in response to the read command and the second address ADD2, the nonvolatile memory device 110 may perform the read operation by using a default set of read voltages among sets of read voltages and may transmit the read data to the memory controller 120.

In operation S330, the error correction code block 127 of the memory controller 120 may perform error correction decoding on the read data. In operation S340, the memory controller 120 may determine whether an error of the read data is corrected. When it is determined that the error of the read data is corrected, the memory controller 120 may terminate the first check read operation.

When it is determined that the error of the read data is not corrected, in operation S350, the memory controller 120 may transmit the read command, the second address ADD2, and voltage information to the nonvolatile memory device 110. The voltage information may include information of read voltages to be used in the read operation of the nonvolatile memory device 110. The nonvolatile memory device 110 may again perform the read operation by using a set of read voltages corresponding to the voltage information from among the sets of read voltages and may transmit the read data to the memory controller 120 in operation S320. Afterwards, operation S330 and operation S340 may again be performed.

A loop including operation S350, operation S320, operation S330, and operation S340 may be performed at least two times. When an error is not corrected even though the loop is performed the given number of times, the memory controller 120 may determine that an uncorrectable error is present in the data corresponding to the second address ADD2. The memory controller 120 may select the selected memory block as a target for the read reclaim operation.

Figure 10:
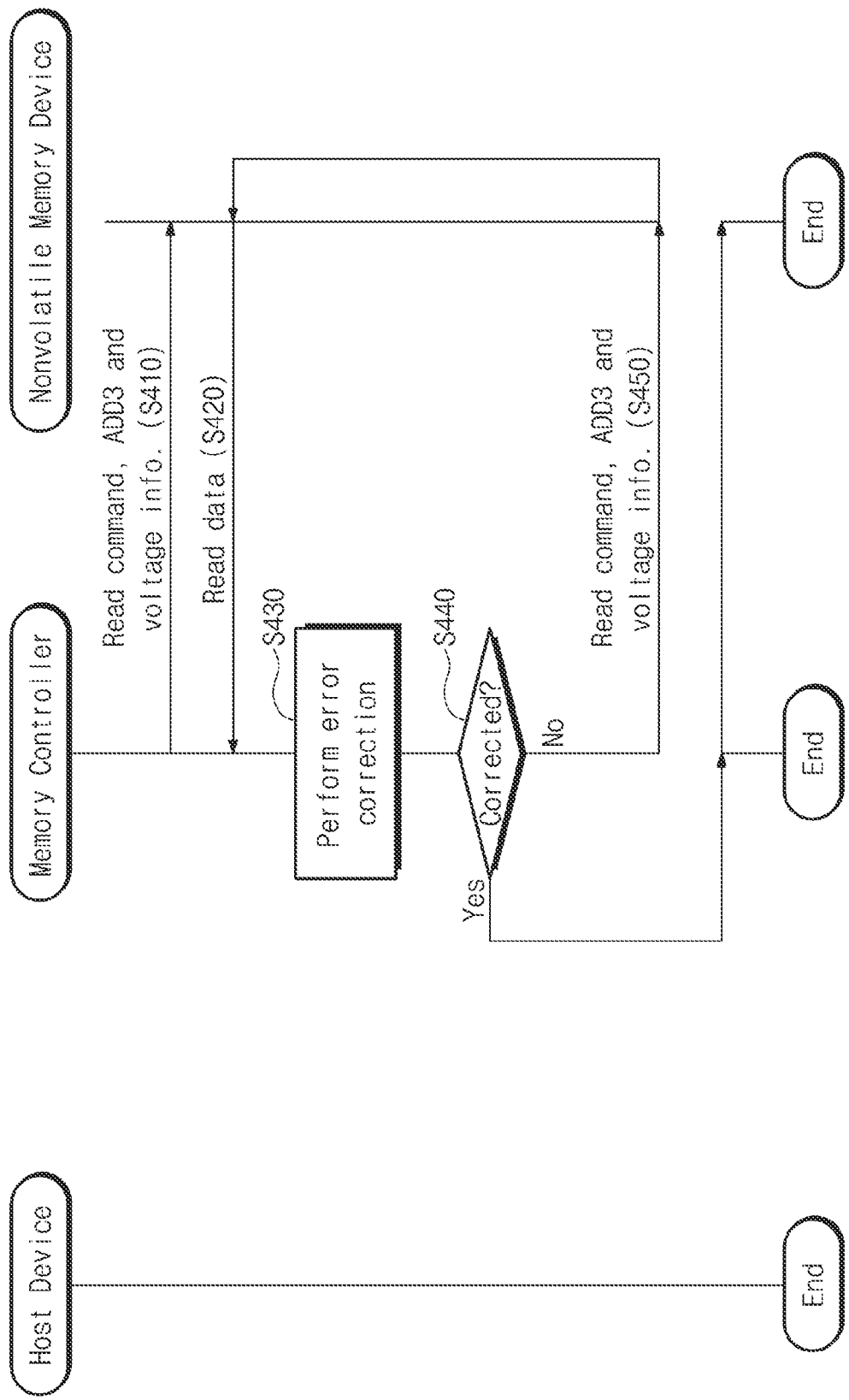
FIG. 10 illustrates an example of a process in which a storage device performs a second check read operation.

FIG. 10 illustrates an example of a process in which the storage device 100 performs a second check read operation. Referring to FIGS. 1 and 10, in operation S410, the memory controller 120 may transmit the read command, a third address ADD3, and voltage information to the nonvolatile memory device 110 in response to determining that the first check read operation succeeds. The voltage information may indicate a set of read voltages that are used in the first check read operation in which error correction succeeds. In an embodiment, when the first check read operation fails, the second check read operation may be omitted.

In operation S420, in response to the read command and the third address ADD3, the nonvolatile memory device 110 may perform the read operation by using the set of read voltages, which are used in the first check read operation in which error correction succeeds, and may transmit the read data to the memory controller 120.

In operation S430, the error correction code block 127 of the memory controller 120 may perform error correction decoding on the read data. In operation S440, the memory controller 120 may determine whether an error of the read data is corrected. When it is determined that the error of the read data is corrected, the memory controller 120 may terminate the second check read operation.

When it is determined that the error of the read data is not corrected, in operation S450, the memory controller 120 may transmit the read command, the third address ADD3, and voltage information to the nonvolatile memory device 110. The voltage information may include information of read voltages to be used in the read operation of the nonvolatile memory device 110. The nonvolatile memory device 110 may again perform the read operation by using the set of read voltages corresponding to the voltage information and may transmit the read data to the memory controller 120 in operation S420. Afterwards, operation S430 and operation S440 may again be performed.

A loop including operation S450, operation S420, operation S430, and operation S440 may be performed at least two times. When an error is not corrected even though the loop is performed the given number of times, the memory controller 120 may determine that an uncorrectable error is present in the data corresponding to the third address ADD5. The memory controller 120 may select the selected memory block as a target for the read reclaim operation.

Figure 11:
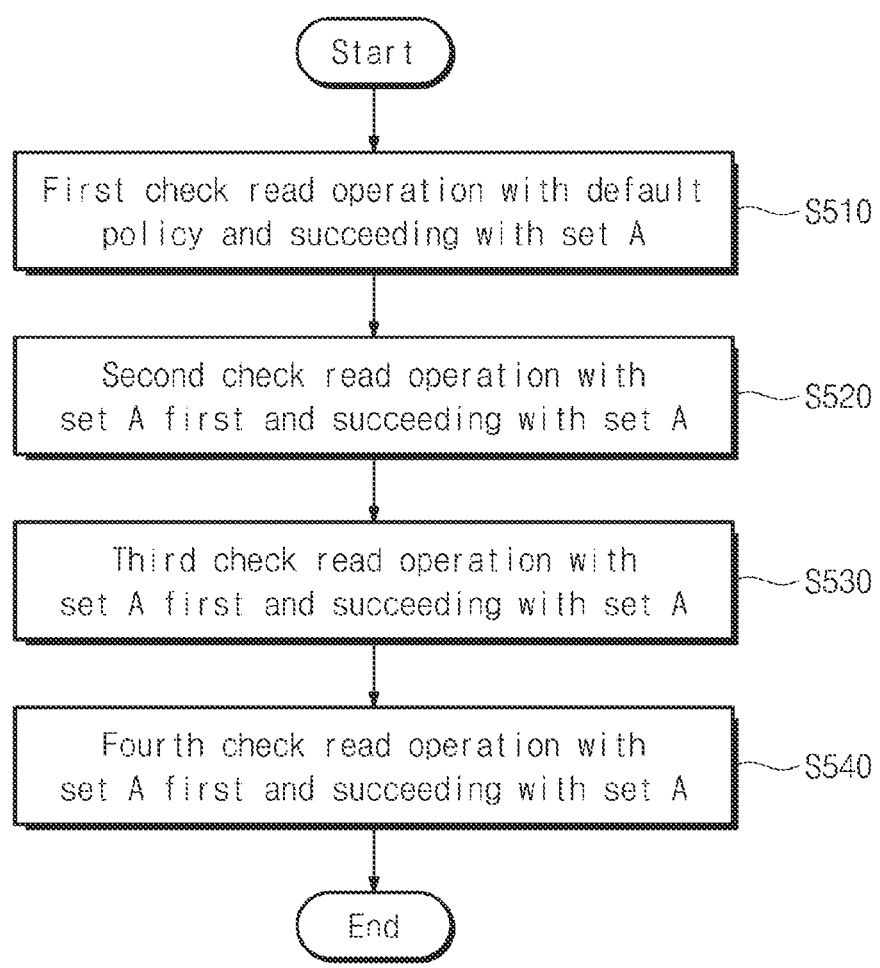
FIG. 11 illustrates a first example of a process in which a storage device performs first to fourth check read operations.

FIG. 11 illustrates a first example of a process in which the storage device 100 performs first to fourth check read operations. Referring to FIGS. 1 and 11, in operation S510, the storage device 100 may perform the first check read operation based on a default policy. According to the default policy, read voltage sets may be sequentially selected from a first read voltage set (e.g., a default read voltage set) to the last read voltage set. In an embodiment, in the first check read operation, a neighbor page or neighbor memory cells may be determined as described with reference to FIG. 5. The storage device 100 may successfully perform error correction by using an "A" read voltage set.

In operation S520, the storage device 100 may start the second check read operation by using the "A" read voltage set. In the second check read operation, a neighbor page or neighbor memory cells may be determined as described with reference to FIG. 6. The storage device 100 may successfully perform error correction by using the "A" read voltage set.

In operation S530, the storage device 100 may start the third check read operation by using the "A" read voltage set. The third check read operation may be performed to be the same as the second check read operation described with reference to FIG. 10. In the third check read operation, a neighbor page or neighbor memory cells may be determined as described with reference to FIG. 7. The storage device 100 may successfully perform error correction by using the "A" read voltage set.

In operation S540, the storage device 100 may start the fourth check read operation by using the "A" read voltage set. The fourth check read operation may be performed to be the same as the second check read operation described with reference to FIG. 10. In the fourth check read operation, a neighbor page or neighbor memory cells may be determined as described with reference to FIG. 7. The storage device 100 may successfully perform error correction by using the "A" read voltage set.

As described with reference to FIG. 11, the second check read operation, the third check read operation, and the fourth check read operation may be initiated by using the "A" read voltage set and error correction may succeed in the second check read operation, the third check read operation, and the fourth check read operation by using the "A" read voltage set. Accordingly, the loop is performed only once in the second check read operation, the third check read operation, and the fourth check read operation. Accordingly, a time necessary for the check read operation may decrease.

The temporal and/or spatial stresses that memory cells included in the same memory block experience may be similar. Degradation information or tendency of the reliability of data written in the memory cells of the same memory block may be similar. Accordingly, as described with reference to FIG. 11, by performing a current check read operation by using a set of read voltages used in a previous check read operation in which error correction succeeds, a speed at which the read operation is performed may be improved, and a time necessary for the check read operation may decrease.

In an embodiment, to reduce a resource necessary to manage the storage device 100, the storage device 100 may delete information of the set of read voltages, which are used in a previous check read operation in which error correction succeeds, after check read operations are completed. As another example, to make the management of the storage device 100 easier, the storage device 100 may retain (or store) the information of the set of read voltages used in a previous check read operation in which error correction succeeds and may refer to the retained (or stored) information when the check read operations are performed by the read operation later.

Figure 12:
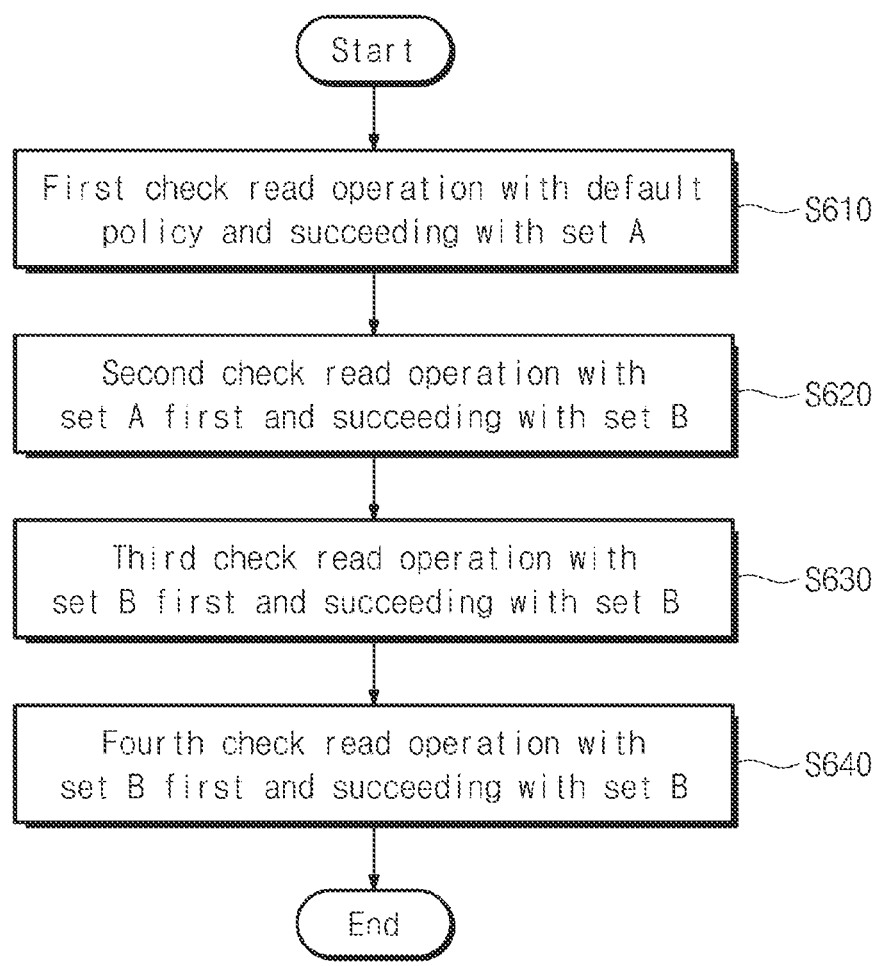
FIG. 12 illustrates a second example of a process in which a storage device performs first to fourth check read operations.

FIG. 12 illustrates a second example of a process in which the storage device 100 performs the first to fourth check read operations. Referring to FIGS. 1 and 12, in operation S610, the storage device 100 may perform the first check read operation based on a default policy. According to the default policy, read voltage sets may be sequentially selected from a first read voltage set (e.g., a default read voltage set) to the last read voltage set. In an embodiment, in the first check read operation, a neighbor page or neighbor memory cells may be determined as described with reference to FIG. 5. The storage device 100 may successfully perform error correction by using the "A" read voltage set.

In operation S620, the storage device 100 may start the second check read operation by using the "A" read voltage set. In the second check read operation, a neighbor page or neighbor memory cells may be determined as described with reference to FIG. 6. The storage device 100 may successfully perform error correction by using a "B" read voltage set.

In operation S630, the storage device 100 may start the third check read operation by using the "B" read voltage set. The third check read operation may be performed to be the same as the second check read operation described with reference to FIG. 10. In the third check read operation, a neighbor page or neighbor memory cells may be determined as described with reference to FIG. 7. The storage device 100 may successfully perform error correction by using the "B" read voltage set.

In operation S640, the storage device 100 may start the fourth check read operation by using the "B" read voltage set. The fourth check read operation may be performed to be the same as the second check read operation described with reference to FIG. 10. In the fourth check read operation, a neighbor page or neighbor memory cells may be determined as described with reference to FIG. 7. The storage device 100 may successfully perform error correction by using the "B" read voltage set.

As described with reference to FIG. 12, while the storage device 100 performs the first to fourth check read operations, a set of read voltages used in a check read operation in which error correction succeeds may be changed from the "A" read voltage set to the "B" read voltage set. The storage device 100 may continue check read operations by using the "B" read voltage set thus changed.

In an embodiment, when error correction succeeds by using a "C" read voltage set in operation S630, in operation S640, the fourth check read operation may be initiated by using the "C" read voltage set.

Figure 13:
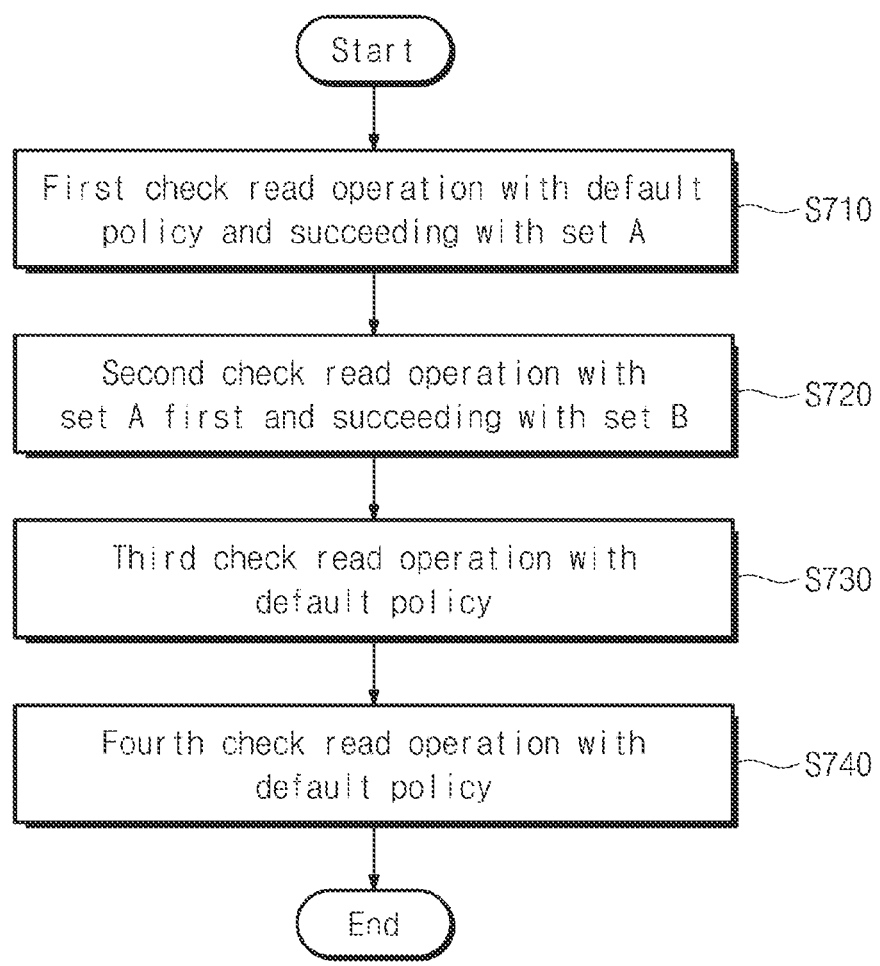
FIG. 13 illustrates a third example of a process in which a storage device performs first to fourth check read operations.

FIG. 13 illustrates a third example of a process in which the storage device 100 performs the first to fourth check read operations. Referring to FIGS. 1 and 13, in operation S710, the storage device 100 may perform the first check read operation based on a default policy. According to the default policy, read voltage sets may be sequentially selected from a first read voltage set (e.g., a default read voltage set) to the last read voltage set. In an embodiment, in the first check read operation, a neighbor page or neighbor memory cells may be determined as described with reference to FIG. 5. The storage device 100 may successfully perform error correction by using the "A" read voltage set.

In operation S720, the storage device 100 may start the second check read operation by using the "A" read voltage set. In the second check read operation, a neighbor page or neighbor memory cells may be determined as described with reference to FIG. 6. The storage device 100 may successfully perform error correction by using the "B" read voltage set.

As error correction using a set of read voltages used in a previous check read operation in which error correction fails the given number of times, in operation S730, the storage device 100 may change a policy for the check read operation based on the default policy such that the third check read operation is performed. The third check read operation may be performed to be the same as the second check read operation described with reference to FIG. 10. In the third check read operation, a neighbor page or neighbor memory cells may be determined as described with reference to FIG. 7.

In operation S740, the storage device 100 may perform the fourth check read operation based on the default policy. The fourth check read operation may be performed to be the same as the second check read operation described with reference to FIG. 10. In the fourth check read operation, a neighbor page or neighbor memory cells may be determined as described with reference to FIG. 7.

As described with reference to FIG. 13, while the storage device 100 performs the first to fourth check read operations, when error correction using a set of read voltages used in a check read operation in which error correction fails a number of times identified by a threshold value, the storage device 100 may change a policy such that check read operations are performed based on the default policy. The threshold value may be adjusted accordingly.

In an embodiment, the examples in which the first to fourth check read operations are performed have been described with reference to FIGS. 11 to 13. However, the number of times that a check read operation (or check read operations) is performed is not limited.

Figure 14:
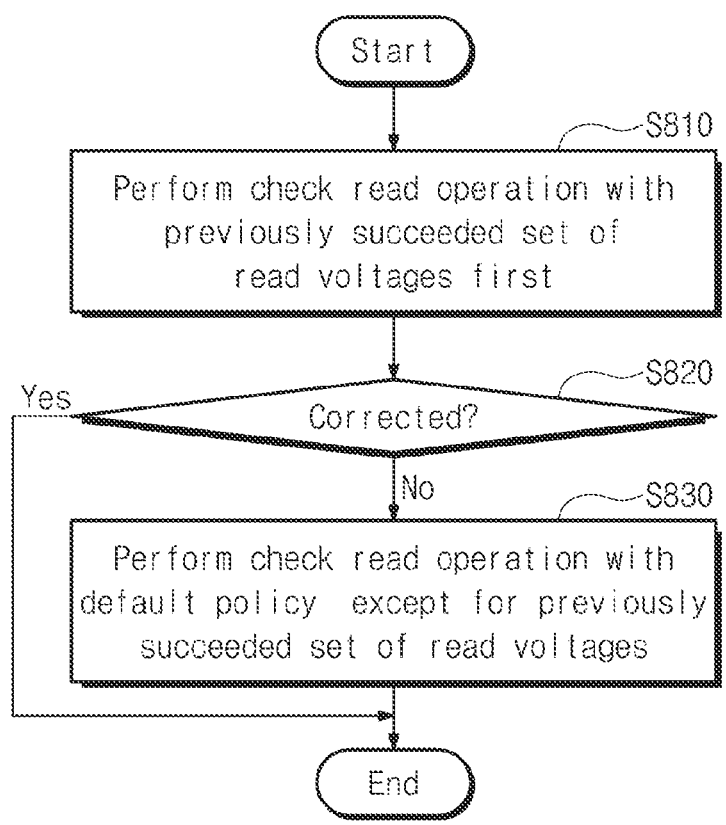
FIG. 14 illustrates an example in which a storage device adjusts read voltages in at least one of second to fourth check read operations.

FIG. 14 illustrates an example in which the storage device 100 adjusts read voltages in at least one of the second to fourth check read operations. Referring to FIGS. 1 and 14, in operation S810, the storage device 100 may perform the check read operation by using a set of read voltages used in a previous check read operation in which error correction succeeds.

In operation S820, the storage device 100 may determine whether an error of the read data is corrected. When the error of the read data is corrected, the check read operation may be terminated. When the error of the read data is not corrected, in operation S830 the storage device 100 may continue the check read operation based on the default policy in a state where the set of read voltages used in a previous check read operation in which error correction succeeds is excluded.

As another example, when the error of the read data is not corrected, the storage device 100 may continue the check read operation while sequentially selecting sets of read voltages in order 1) from a set of read voltages most similar in level to the set of read voltages, which are used in a previous check read operation in which error correction succeeds 2) to a set of read voltages least similar in level to the set of read voltages used in the previous check read operation.

Figure 15:
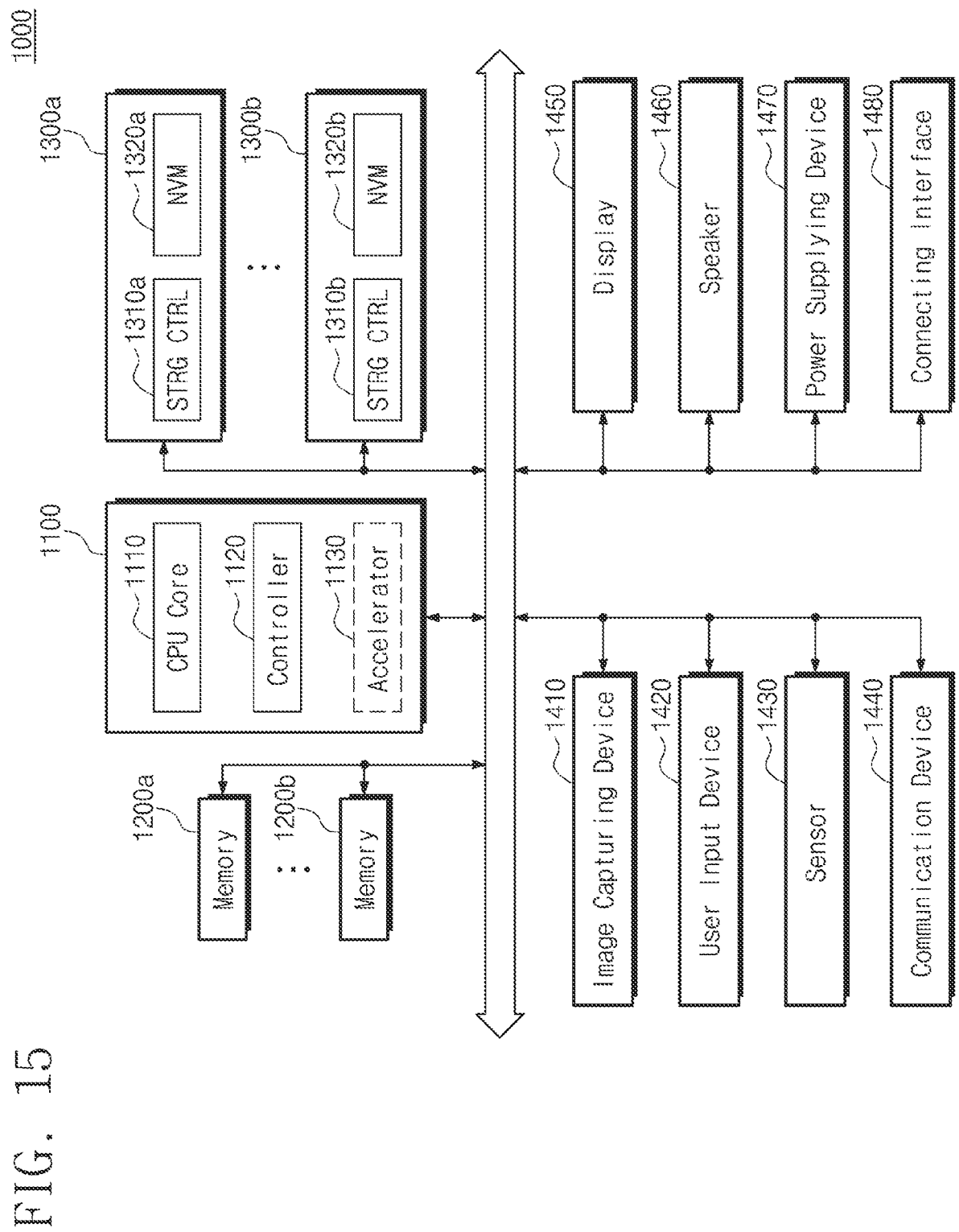
FIG. 15 is a diagram illustrating a system according to an embodiment of the present disclosure.

FIG. 15 is a diagram of a system 1000 to which a storage device is applied, according to an embodiment. The system 1000 of FIG. 15 may basically be a mobile system, such as a portable communication terminal (e.g., a mobile phone), a smartphone, a tablet personal computer (PC), a wearable device, a healthcare device, or an Internet of things (IOT) device. However, the system 1000 of FIG. 15 is not necessarily limited to the mobile system and may be a PC, a laptop computer, a server, a media player, or an automotive device (e.g., a navigation device).

Referring to FIG. 15, the system 1000 may include a main processor 1100, memories (e.g., 1200a and 1200b), and storage devices (e.g., 1300a and 1300b). In addition, the system 1000 may include at least one of an image capturing device 1410, a user input device 1420, a sensor 1430, a communication device 1440, a display 1450, a speaker 1460, a power supplying device 1470, and a connecting interface 1480.

The main processor 1100 may control all operations of the system 1000, more specifically, operations of other components included in the system 1000. The main processor 1100 may be implemented as a general-purpose processor, a dedicated processor, or an application processor.

The main processor 1100 may include at least one CPU core 1110 and further include a controller 1120 configured to control the memories 1200a and 1200b and/or the storage devices 1300a and 1300b. In some embodiments, the main processor 1100 may further include an accelerator 1130, which is a dedicated circuit for a high-speed data operation, such as an artificial intelligence (AI) data operation. The accelerator 1130 may include a graphics processing unit (GPU), a neural processing unit (NPU) and/or a data processing unit (DPU) and be implemented as a chip that is physically separate from the other components of the main processor 1100.

The memories 1200a and 1200b may be used as main memory devices of the system 1000. Although each of the memories 1200a and 1200b may include a volatile memory, such as static random access memory (SRAM) and/or dynamic RAM (DRAM), each of the memories 1200a and 1200b may include non-volatile memory, such as a flash memory, phase-change RAM (PRAM) and/or resistive RAM (RRAM). The memories 1200a and 1200b may be implemented in the same package as the main processor 1100.

The storage devices 1300a and 1300b may serve as non-volatile storage devices configured to store data, regardless of whether power is supplied thereto, and have larger storage capacity than the memories 1200a and 1200b. The storage devices 1300a and 1300b may respectively include storage controllers (STRG CTRL) 1310a and 1310b and NVMs (Non-Volatile Memories) 1320a and 1320b configured to store data via the control of the storage controllers 1310a and 1310b. Although the NVMs 1320a and 1320b may include flash memories having a two-dimensional (2D) structure or a three-dimensional (3D) V-NAND structure, the NVMs 1320a and 1320b may include other types of NVMs, such as PRAM and/or RRAM.

The storage devices 1300a and 1300b may be physically separated from the main processor 1100 and included in the system 1000 or implemented in the same package as the main processor 1100. In addition, the storage devices 1300a and 1300b may have types of solid-state devices (SSDs) or memory cards and be removably combined with other components of the system 1000 through an interface, such as the connecting interface 1480 that will be described below. The storage devices 1300a and 1300b may be devices to which a standard protocol, such as a universal flash storage (UFS), an embedded multi-media card (eMMC), or a non-volatile memory express (NVMe), is applied, without being limited thereto.

The image capturing device 1410 may capture still images or moving images. The image capturing device 1410 may include a camera, a camcorder, and/or a webcam.

The user input device 1420 may receive various types of data input by a user of the system 1000 and include a touch pad, a keypad, a keyboard, a mouse, and/or a microphone.

The sensor 1430 may detect various types of physical quantities, which may be obtained from the outside of the system 1000, and convert the detected physical quantities into electric signals. The sensor 1430 may include a temperature sensor, a pressure sensor, an illuminance sensor, a position sensor, an acceleration sensor, a biosensor, and/or a gyroscope sensor.

The communication device 1440 may transmit and receive signals between other devices outside the system 1000 according to various communication protocols. The communication device 1440 may include an antenna, a transceiver, and/or a modem.

The display 1450 and the speaker 1460 may serve as output devices configured to respectively output visual information and auditory information to the user of the system 1000.

The power supplying device 1470 may appropriately convert power supplied from a battery (not shown) embedded in the system 1000 and/or an external power source and supply the converted power to each of components of the system 1000.

The connecting interface 1480 may provide connection between the system 1000 and an external device, which is connected to the system 1000 and capable of transmitting and receiving data to and from the system 1000. The connecting interface 1480 may be implemented by using various interface schemes, such as advanced technology attachment (ATA), serial ATA (SATA), external SATA (e-SATA), small computer small interface (SCSI), serial attached SCSI (SAS), peripheral component interconnection (PCI), PCI express (PCIe), NVMe, IEEE 1394, a universal serial bus (USB) interface, a secure digital (SD) card interface, a multi-media card (MMC) interface, an eMMC interface, a UFS interface, an embedded UFS (eUFS) interface, and a compact flash (CF) card interface.

In an embodiment, the storage device 100 described with reference to FIGS. 1 to 14 may be implemented with the storage device 1300a/1300b.

In the above embodiments, components according to embodiments of the present disclosure are referenced by using blocks. The blocks may be implemented with various: (1) hardware devices, such as an integrated circuit, an application specific IC (ASIC), a field programmable gate array (FPGA), and a complex programmable logic device (CPLD); (2) firmware driven in hardware devices; (3) software such as an application; or (4) a combination of a hardware device and software. Also, the blocks may include circuits implemented with semiconductor elements in an integrated circuit, or circuits enrolled as an intellectual property (IP).

According to embodiments of the present disclosure, read levels of a check read operation may be adjusted with reference to read levels of a previous check read operation. Because the temporal and/or spatial locality is applied to the read levels of the check read operation, a time taken to perform the check read operation and/or the number of times that the check read operation is performed may be reduced.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A storage device comprising:
a nonvolatile memory device including a plurality of memory blocks, wherein each of the plurality of memory blocks includes a plurality of cell strings each including at least one ground selection transistor, two or more memory cells, and at least one string selection transistor stacked on a substrate in a direction perpendicular to the substrate; and
a memory controller, wherein:
in a selected memory block selected from the plurality of memory blocks, the memory controller controls the nonvolatile memory device to perform a read operation on memory cells belonging to a selected page from among the memory cells in the plurality of cell strings,
after the read operation in the selected memory block, the memory controller controls the nonvolatile memory device to perform a first check read operation on memory cells of a first neighbor page associated with the selected page while sequentially selecting sets of read voltages,
after the first check read operation in the selected memory block, the memory controller controls the nonvolatile memory device to perform a second check read operation on memory cells of a second neighbor page associated with the selected page while sequentially selecting the sets of read voltages, and
in the second check read operation, the memory controller first selects a set of read voltages that are used in the first check read operation and for which error correction succeeds, from among the sets of read voltages.

2. The storage device of claim 1, wherein in response to determining that the read operation is performed in the selected memory block at least a number of times identified by a threshold value, the memory controller controls the nonvolatile memory device to perform the first check read operation and the second check read operation.

3. The storage device of claim 1, wherein until the error correction associated with data read from the nonvolatile memory device succeeds, the memory controller controls the nonvolatile memory device to perform the first check read operation while sequentially selecting the sets of read voltages.

4. The storage device of claim 3, wherein in response to determining a failure of the error correction associated with data read from the nonvolatile memory device using the sets of read voltages in the first check read operation, the memory controller selects the selected memory block as a target of a read reclaim operation.

5. The storage device of claim 3, wherein the memory controller:
selects a first set of read voltages from the sets of read voltages by transmitting a read command to the nonvolatile memory device, and
selects a second set of read voltages from the sets of read voltages by transmitting the read command and voltage information to the nonvolatile memory device.

6. The storage device of claim 1, wherein the memory controller selects one of an upper page and a lower page of the selected page as the first neighbor page.

7. The storage device of claim 1, wherein until the error correction associated with data read from the nonvolatile memory device succeeds, the memory controller controls the nonvolatile memory device to perform the second check read operation while sequentially selecting the sets of read voltages.

8. The storage device of claim 7, wherein in response to determining a failure of the error correction associated with data read from the nonvolatile memory device using the sets of read voltages in the second check read operation, the memory controller selects the selected memory block as a target of a read reclaim operation.

9. The storage device of claim 7, wherein the memory controller selects a first set of read voltage from the sets of read voltages by transmitting to the nonvolatile memory device a read command and first voltage information indicating a set of read voltages used in the first check read operation and for which the error correction succeeds.

10. The storage device of claim 1, wherein the memory controller selects as the second neighbor page one of the remaining:
upper pages other than a vertically immediately placed upper page among upper pages of the selected page, and
lower pages other than a vertically immediately placed lower page among lower pages of the selected page.

11. The storage device of claim 1, wherein:
after the second check read operation in the selected memory block, the memory controller controls the nonvolatile memory device to perform a third check read operation on memory cells of a third neighbor page associated with the selected page while sequentially selecting the sets of read voltages, and
in the third check read operation, the memory controller first selects a set of read voltages that are used in the second check read operation and for which the error correction succeeds, from among the sets of read voltages.

12. The storage device of claim 11, wherein the memory controller selects the third neighbor page based on one of page addresses stored in advance.

13. The storage device of claim 11, wherein:
after the third check read operation in the selected memory block, the memory controller controls the nonvolatile memory device to perform a fourth check read operation on memory cells of a fourth neighbor page associated with the selected page while sequentially selecting the sets of read voltages, and in the fourth check read operation, the memory controller first selects a set of read voltages that are used in the third check read operation and for which the error correction succeeds, from among the sets of read voltages.

14. An operating method of a storage device which includes a nonvolatile memory device including a plurality of memory cells arranged on a substrate in rows and columns and stacked in a direction perpendicular to the substrate, and a memory controller, the method comprising:

receiving, at the memory controller, a read request from an external host device;

performing, at the storage device, a read operation on selected memory cells of the nonvolatile memory device in response to the read request;

performing, at the storage device, a first check read operation on first neighbor memory cells of the selected memory cells of the nonvolatile memory device while sequentially selecting sets of read voltages;

performing, at the storage device, a second check read operation on second neighbor memory cells of the selected memory cells of the nonvolatile memory device while sequentially selecting the sets of read voltages; and first selecting, at the storage device, a set of read voltages, which are used in the first check read operation and for which error correction succeeds, from among the sets of read voltages, in the second check read operation.

15. The method of claim 14, wherein the performing of the read operation includes:

transmitting, at the memory controller, a read command to the nonvolatile memory device;

performing, at the nonvolatile memory device, a read operation by using first read voltages in response to the read command, such that data read through the read operation are transmitted to the memory controller;

performing, at the memory controller, error correction decoding on the read data;

transmitting, at the memory controller, the error correction decoded data to the external host device in response to determining that the error correction decoding succeeds; and transmitting, at the memory controller, the read command and voltage information to the nonvolatile memory device in response to determining that the error correction decoding fails.

16. The method of claim 14, wherein the performing of the first check read operation includes:

transmitting, at the memory controller, a read command to the nonvolatile memory device;

performing, at the nonvolatile memory device, a read operation by using one set of read voltages among the sets of read voltages in response to the read command, such that data read through the read operation are transmitted to the memory controller;

performing, at the memory controller, error correction decoding on the read data;

terminating, at the memory controller, the first check read operation in response to determining that the error correction decoding succeeds; and transmitting, at the memory controller, the read command and voltage information indicating a next set of read voltages among the sets of read voltages to the nonvolatile memory device in response to determining that the error correction decoding fails.

17. The method of claim 14, wherein the performing of the second check read operation includes:

transmitting, at the memory controller and to the nonvolatile memory device, a read command and voltage information that indicates a set of read voltages used in the first check read operation and for which the error correction succeeds;

performing, at the nonvolatile memory device, a read operation by using the set of read voltages that are used in the first check read operation and for which the error correction succeeds, from among the sets of read voltages, in response to the read command, such that data read through the read operation are transmitted to the memory controller;

performing, at the memory controller, error correction decoding on the read data; and terminating, at the memory controller, the second check read operation in response to determining that the error correction decoding succeeds.

18. The method of claim 17, wherein the performing of the second check read operation further includes one of:

transmitting, at the memory controller, the read command and voltage information indicating a next set of read voltages among the sets of read voltages to the nonvolatile memory device in response to determining that the error correction decoding fails; and transmitting, at the memory controller, the read command to the nonvolatile memory device in response to determining that the error correction decoding fails.

19. The method of claim 14, further comprising:

performing, at the storage device, a third check read operation on third neighbor memory cells of the selected memory cells of the nonvolatile memory device while sequentially selecting the sets of read voltages, wherein in the third check read operation, the storage device first selects a set of read voltages that are used in the second check read operation and for which the error correction succeeds, from among the sets of read voltages.

20. An operating method of a storage device which includes a nonvolatile memory device, including a plurality of memory cells arranged on a substrate in rows and columns and stacked in a direction perpendicular to the substrate, and a memory controller, the method comprising:

receiving, at the memory controller, a read request from an external host device;

performing, at the storage device, a read operation on selected memory cells of the nonvolatile memory device in response to the read request;

performing, at the storage device, a first check read operation on first neighbor memory cells of the selected memory cells of the nonvolatile memory device while sequentially selecting sets of read voltages; and performing, at the storage device, a second check read operation on second neighbor memory cells of the selected memory cells of the nonvolatile memory device while sequentially selecting the sets of read voltages, wherein:

in the second check read operation, the storage device first selects a set of read voltages that are used in the first check read operation and for which error correction succeeds, from among the sets of read voltages, the performing of the read operation includes:

transmitting, at the memory controller, a first read command to the nonvolatile memory device;

performing, at the nonvolatile memory device, the read operation by using first read voltages in response to the first read command, such that first data read through the read operation are transmitted to the memory controller;

performing, at the memory controller, error correction decoding on the first data;

transmitting, at the memory controller, the error correction decoded first data to the external host device in response to determining that the error correction decoding succeeds; and transmitting, at the memory controller, the first read command and first voltage information to the nonvolatile memory device in response to determining that the error correction decoding fails, the performing of the first check read operation includes:

transmitting, at the memory controller, a second read command to the nonvolatile memory device;

performing, at the nonvolatile memory device, a read operation by using one set of read voltages among the sets of read voltages in response to the second read command, such that second data read through the read operation are transmitted to the memory controller;

performing, at the memory controller, the error correction decoding on the second data;

terminating, at the memory controller, the first check read operation in response to determining that the error correction decoding succeeds; and transmitting, at the memory controller, the second read command and second voltage information indicating a next set of read voltages among the sets of read voltages to the nonvolatile memory device in response to determining that the error correction decoding fails, and the performing of the second check read operation includes:

transmitting, at the memory controller and to the nonvolatile memory device, a third read command and third voltage information that indicates a set of read voltages used in the first check read operation and for which the error correction succeeds;

performing, at the nonvolatile memory device, a read operation by using the set of read voltages that are used in the first check read operation and for which the error correction succeeds, from among the sets of read voltages, in response to the third read command, such that third data read through the read operation are transmitted to the memory controller;

performing, at the memory controller, the error correction decoding on the third data; and terminating, at the memory controller, the second check read operation in response to determining that the error correction decoding succeeds.

* * * * *